United States Patent
Wozniak

(10) Patent No.: US 7,865,344 B2
(45) Date of Patent: Jan. 4, 2011

(54) METHOD AND SYSTEM FOR AUTOMATICALLY GENERATING A GLOBAL SIMULATION MODEL OF AN ARCHITECTURE

(75) Inventor: Andrzej Wozniak, Palaiseau (FR)

(73) Assignee: Bull S.A., Les Clayes Sous Bois (FR)

( * ) Notice: Subject to any disclaimer, the term of this patent is extended or adjusted under 35 U.S.C. 154(b) by 896 days.

(21) Appl. No.: 10/627,977

(22) Filed: Jul. 28, 2003

(65) Prior Publication Data
US 2004/0162805 A1 Aug. 19, 2004

(30) Foreign Application Priority Data
Jul. 30, 2002 (FR) .................................. 02 09690

(51) Int. Cl.
*G06G 7/48* (2006.01)
*G06G 7/58* (2006.01)
*G06F 17/50* (2006.01)

(52) U.S. Cl. .......................................... 703/13; 703/14
(58) Field of Classification Search .............. 703/13–17
See application file for complete search history.

(56) References Cited

U.S. PATENT DOCUMENTS

| 5,111,413 | A | * | 5/1992 | Lazansky et al. ............... 703/14 |
| 5,568,407 | A | * | 10/1996 | Hass et al. .................... 702/118 |
| 5,752,002 | A | | 5/1998 | Arunarthi et al. |
| 6,263,303 | B1 | | 7/2001 | Yu et al. |
| 7,020,722 | B2 | * | 3/2006 | Sivier et al. .................. 709/248 |
| 2001/0021903 | A1 | | 9/2001 | Ryu et al. |
| 2002/0073375 | A1 | | 6/2002 | Hollander |
| 2003/0069724 | A1 | * | 4/2003 | Schubert et al. ................ 703/16 |
| 2003/0093252 | A1 | * | 5/2003 | Frankel et al. ................. 703/13 |
| 2003/0093253 | A1 | * | 5/2003 | Freyensee et al. ............. 703/13 |
| 2003/0093254 | A1 | * | 5/2003 | Frankel et al. ................. 703/13 |
| 2003/0093255 | A1 | * | 5/2003 | Freyensee et al. ............. 703/13 |
| 2003/0093256 | A1 | * | 5/2003 | Cavanagh et al. ............. 703/14 |
| 2003/0093257 | A1 | * | 5/2003 | Cavanagh et al. ............. 703/14 |
| 2003/0093569 | A1 | * | 5/2003 | Sivier et al. .................. 709/248 |

FOREIGN PATENT DOCUMENTS

WO WO 01 90961 A 11/2001

OTHER PUBLICATIONS

OrCAD, OrCAD Layout "Autorouter User's Guide", Second edition, May 31, 2000.*
Yalamanchili, Sudhakar, "VHDL: From Simulation to Synthesis", School of Electrical and Computer Engineering, Georgia Institute of Technology, Feb. 4, 2000.*

* cited by examiner

*Primary Examiner*—David Silver
(74) *Attorney, Agent, or Firm*—Miles & Stockbridge P.C.

(57) ABSTRACT

A method for creating a global simulation model of an architecture for models of integrated circuits under development, including reading an architecture description file of the global model and storing information related to all of the possible configurations instantiating the components and storing the corresponding information, topologically connecting the interface signals, physically connecting the interface signals, at the level of each instance of the components using a component and connection rule table, and storing the corresponding information, and automatically generating the HDL-type and HLL-type source files of the global simulation model.

28 Claims, 15 Drawing Sheets

Generic Structure of an Elementary Model

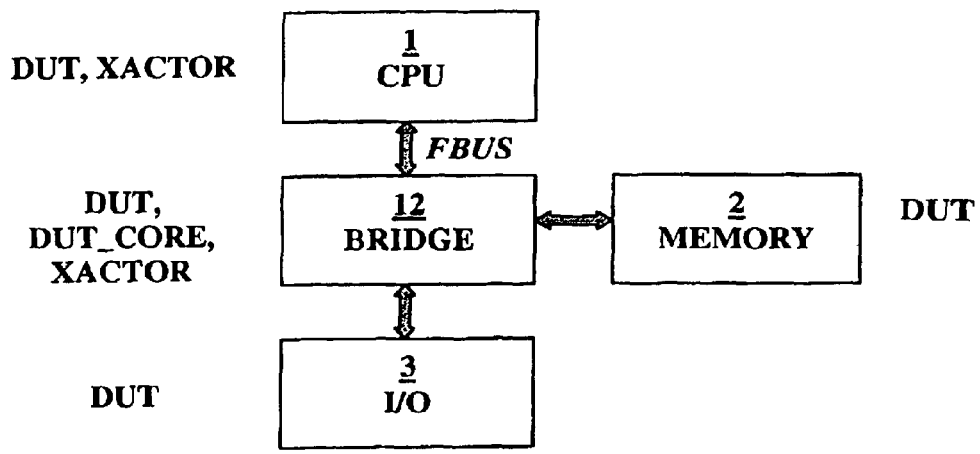
FIGURE 1
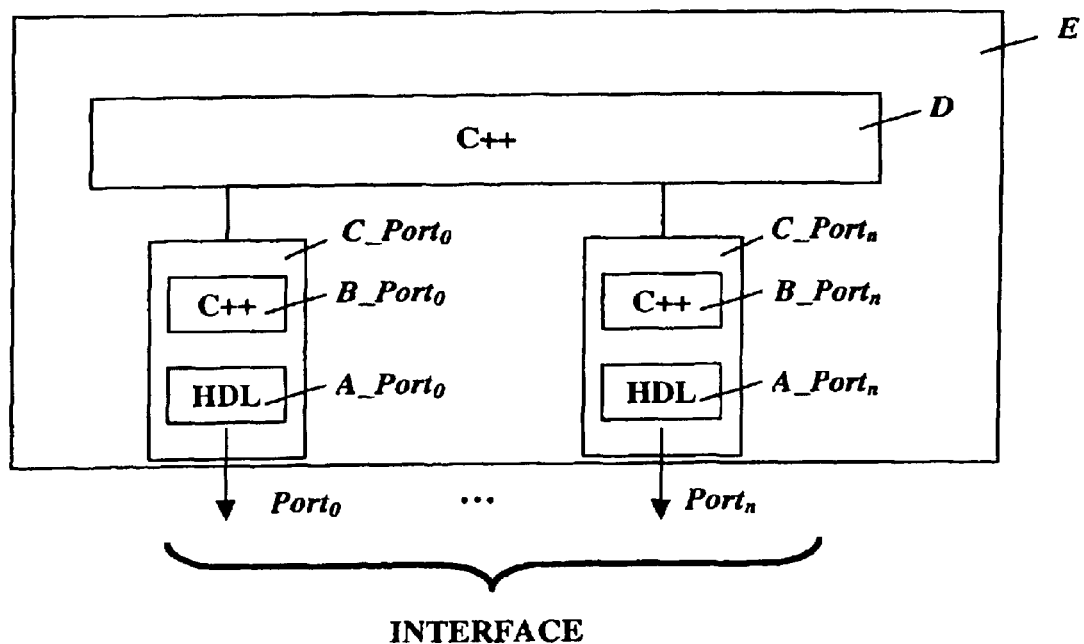
Figure 5 : Generic structure of a C++ Composite Model

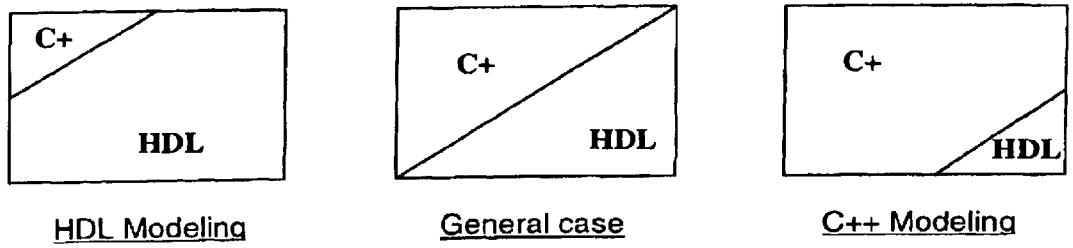

| | | |
|---|---|---|
| HDL Modeling | General case | C++ Modeling |
| Figure 3A | Figure 3B | Figure 3C |

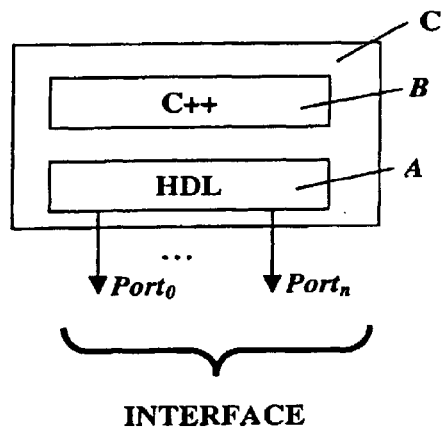

Figure 4 : Generic Structure of an Elementary Model

| | |
|---|---|
| TCRC | %InstNameModuleMap |
| TCRC | %SysConnectMap |
| TCRC | %SysSpecMap |
| TCRC | %SysWrapMap |
| TCRC | %SysPinConst |
| TCRC | %Activity_TypeMap |
| TCRC | %PortProbeMap |
| TRCOH | %HwfConnectivityMap |
| TRCOH | %HwifAlternateMap |
| TFMT | %moduleToCppClassMap |
| TFMT | %classCppProtoMap |

Figure 6

METHOD AND SYSTEM FOR AUTOMATICALLY GENERATING A GLOBAL SIMULATION MODEL OF AN ARCHITECTURE

The subject matter of this application is related to application Ser. No. 10/627,690 (now U.S. Pat. No. 7,080,331), filed concurrently herewith in the name of Andrzej WOZNIAK, entitled "METHOD AND SYSTEM FOR AUTOMATIC RECOGNITION OF SIMULATION CONFIGURATIONS OF AN INTEGRATED NETWORK". The present application also claims the priority of French Application No. FR 02/09690 filed Jul. 30, 2002, the content of which is incorporated herein by reference in its entirety.

This application includes a computer program listing contained on a single compact disc in one file "application Ser. No. 10/627,977 Appendices A1-A5.txt," which material is hereby incorporated by reference as if fully set forth herein.

FIELD OF THE INVENTION

The invention relates to a method and a system for generating a global simulation model of an architecture. More particularly, the invention relates to a configuration method and a system called a "Configurator" for implementing the method.

BACKGROUND

With the increasing complexity of hardware systems, it is necessary, in order to verify systems or integrated circuits under design, to be able to handle configurations that increasingly include models written in a hardware description language, for example of the HDL type (such as VHDL or Verilog, the most widely used), and in a high level languages of the HLL type (such as C or $C^{++}$); these languages describe, on the one hand, the elements constituting the hardware, and on the other hand, the models constituting the simulation environment.

The term "Configuration" will be used to refer to a set of software models of elements called "Components," constituting a global simulation model.

The invention can be used to verify the design of ASICS by simulating their operation, for example in an environment identical or very similar to their end use, the configuration method making it possible to choose components and their software models from a plurality of available models in order to create simulation configurations. In the prior art, the configurations are rigid, and traditionally prepared "by hand" using text editors or graphics editors, based on a predefined list of possible configurations. Each modification in the model in HDL language requires manual corrections to be incorporated into all of the configurations. This happens several times during the development of an ASIC and constitutes a source of errors and modification problems, resulting in production delays. Modifications of a configuration are often sources of errors that are hard to find, as the size of some configurations can reach tens of thousands of lines, making them difficult to handle manually.

The time required to write and debug a configuration can be very long, making it difficult to generate and add new configurations into the environment. For that reason, when an environment contains a lot of elements for which it is difficult to predict all of the usable configurations, the use of certain configuration variants that facilitate debugging (simplified target configurations, for example) is often avoided.

These problems are accentuated in the more and more widely used co-simulation environments, wherein the models come from different sources and are written in high level programming languages (HLL) such as C or $C^{++}$, or in hardware description languages (HDL) such as VERILOG or VHDL. For the same component of the configuration, there are often several models (ex: functional, in high level programming languages; behavioral, in HDL, synthesizable HDL, etc.) that it would be desirable to be able to use transparently, as needed.

Moreover, the models to be connected often have, at the level of the connecting interfaces, differences requiring the use of adaptation modules. This is the case, for example, for circuits with sophisticated input/output interfaces for which the logical level of the protocol is simulated first, the physical level being developed near the end of the project. The ability to choose adaptation models for the variants of HDL interfaces corresponding to the various development phases of the project constitutes an additional degree of freedom that complicates the writing of the configurations even more. Another problem stems from the fact that mixed HDL (for example Verilog or VHDL)/HLL (for example C++) type models developed separately must be updated coherently. In the case of nonautomated management, this is a potential source of errors.

One object of the present invention is to limit one or more of these drawbacks.

SUMMARY OF THE INVENTION

To this end, the invention primarily relates to a method of automatic generation, by means of a data processing system associated with a program called a Configurator for creating a global simulation model of an architecture comprising models of integrated circuits under development that can constitute, with the help of the automatic Configurator, a machine or a part of a machine, and environment simulation models that make it possible to test and verify the circuit under development, a configuration definition file for components of the architecture, these components constituting fixed functional blocks for describing the functionalities of integrated circuits or parts of integrated circuits, the components being chosen by the user from a library of various component types and a library of environment components, in order to create the global model of the architecture corresponding to the functional specification defined in the configuration definition file and conforming to the specification of the architecture of the global model specified by an architecture description file, comprising:

reading the architecture description file of the global model and the storage, in a component and connection rule table, in a connection coherency rule table, and in a source file formatting table, of information related to all of the possible configurations, with each component obtaining a name that unambiguously identifies its position in the architecture, and a type from among several types (Active Components, Monitoring and Verification Blocks, Intermediate Blocks, System Blocks and Global Blocks);

instantiating the components specified in the configuration definition file by the user-developer using a list of the components present, designated by their names and types and including parameters or invoking procedures, the configuration definition file comprising a file from which components are selected together with their types and optional additional indications concerning the type of interface and the server involved in the configuration to be generated by the Configurator, and storing the corresponding information in the instance connection table;

topologically connecting the instances and storing the corresponding information in the instance connection table;

physically connecting the interface signals, at the level of each instance of the components, by applying regular expressions, stored in the component and connection rule table, based on the names of the signals constituting a wiring table, and using the instance connection table, the wiring table and the formatting table to automatically generate HDL-type and HLL-type source files of the global simulation model corresponding to the configuration specified by the configuration definition file.

According to another characteristic of the method, the Configurator system transmits to the HLL-type parts of each component information on:

the name of the component, the type of the instance, and the HDL path, i.e. the hierarchical name of the component in the description of the model.

According to another characteristic of the method, the configuration definition file also includes a keyword indicating the name or number of the server in which a component is instantiated, when the method is used in a multi-server system.

According to another characteristic of the method, in the case of a multi-server utilization, the Configurator system executes the following steps:

the division of the Configuration into several (HDL-type and HLL-type) parts, sorting the HDL-type components and the HLL-type objects according to the servers to which they belong, the generation of the HDL-type peripheral components used for sending and receiving signals between the parts of the configuration, the duplication of the Global Blocks by the Configurator system and the instantiation of the Global Blocks duplicated in each server, and the generation of HLL-type parts that serve as a communication medium between the servers.

According to another characteristic of the method, the automatic connection between the components by the Configurator system includes several phases:

a high-level topological phase for selecting the components and their respective positions, a wiring phase for creating the actual connection between the components, this phase generating as a result a wiring table that associates the signals connected to one other with the unique name of the wire that connects them, and a phase for generating HDL-type and HLL-type source files.

According to another characteristic of the method, the wiring phase is performed by the Configurator system comprises:

a. connecting the Global Blocks and the System Blocks to all of the components;

b. connecting, or "wiring", the signals between the;

c. making an additional pass to connect the remaining unconnected signals of each component to predetermined signals in order to produce a given stable state; and d. generating, via the Configurator system, partial configurations comprising a subset of the architecture.

According to another characteristic of the method, the predetermined signals are the signals of the System Block corresponding to the component.

According to another characteristic, the description file of the architecture of the global model includes the simulation models of the Global Blocks and the System Blocks, these two types of components being connected to one another and handling environment signals.

According to another characteristic, the System Blocks are connected to the other components and supply them with the system signals that are specific to them.

According to another characteristic of the method, the data processing system performs a conformity check of the connections, comparing the connection table of the real instances between blocks to the connection coherency rule table.

According to another characteristic of the method, the data processing system compares the physical connections between the components to the connection coherency rule table, in order to detect any incompatibilities between the ends of the connections between the components, and in such a case, it specifies, and adds into the instance connection table, an adapter component inserted into the connection in question.

According to another characteristic, the configuration definition file includes information, specified by an attribute, concerning the utilization of adapter components with the instances of the active Components, whose connections are compared by the data processing system to the instance connection table in order to detect any incompatibilities between the ends of the connections between the components, and in such a case where incompatibility is detected it specifies, and adds into the instance connection table, another adapter component inserted into the connection in question. According to another characteristic of the method, the data processing system selects certain connections between the components of the connection coherency rule table and specifies, and adds into the instance connection table, additional connections constituting branches leading to respective additional models, which represent tools for monitoring the connections.

According to another characteristic of the method, during the source file generation phase, the Configurator system generates the source files in HDL language and in HLL language, based on the content of the component and connection rule table, the connection coherency rule table, the source file formatting table, the instance connection table and the wiring table.

According to another characteristic of the method, the data processing system executes an operation through the Configurator system for each configuration variant, in order to obtain several simulation models corresponding to the same functional specification, but written in a description comprising various mixtures of languages of different levels (HDL, HLL).

According to another characteristic of the method, the data processing system generates the functional specification of the global simulation model in a computer format compatible with a high-level programming language, (HLL) and in a format compatible with a hardware description language (HDL).

According to another characteristic of the method, the configuration definition file comprises, for each component, at least one part in HDL-type language, in order to provide an interface with other models.

According to another characteristic of the method, the models that include a part in HLL-type language include interface adapters.

According to another characteristic, the Configurator system chooses each interface adapter model as a function of the connection coherency rule table.

According to another characteristic of the method, the connections of the physical signals are specified by "Ports," each port being an arbitrary selection of signals from the HDL-type interface of a component by means of regular expressions based on the names of these signals, and being constituted by regular expression/substitute expression pairs, these expressions being successively applied to the name of each signal of the HDL-type interface, and if the final substitution is identical for two signals, the latter are connected to one another, the connection being stored in the wiring table.

According to another characteristic of the method, each interface adapter being shared among several models connected to the same port, only one of these models transmits signals through said port.

Another object of the invention is to offer a Configurator system that makes it possible to eliminate one or more of the preceding drawbacks.

This object is achieved by the data processing system for automatically generating a global simulation model of a configuration of fixed functional blocks, mutually connected by interworking connections so as to constitute the global simulation model of an architecture comprising models of integrated circuits under development that can constitute a machine that conforms to the functional specification of a configuration, this system being characterized in that the data processing system uses a Configurator program that includes means for creating a simulation of the wiring by applying stored regular expressions, and for using a configuration definition file in a high level language, a component and connection rule table describing the properties (type, HDL-type interfaces, ports, constructors of HLL class objects, etc.) of the software components for simulating the circuit, a connection coherency rule table in a high level language (HLL), means for instantiating the elements resulting from the configuration definition file, and an HLL code generator that combines the parameters of the components with the connection rules. According to another characteristic of the system, there are at least five types of components: Active Components, Monitoring and Verification Blocks, Intermediate Blocks, System Blocks and Global Blocks.

According to another characteristic of the system, it is equipped to perform a conformity check of the connections by comparing the instance connection table with a table of coherency rules for the physical connections between the models chosen from the blocks constituting the global model.

According to another characteristic of the system, it is equipped to compare the connection table of the real instances between blocks to the connection coherency rule table, in order to detect any incompatibilities between the ends of the connections between blocks, and in such a case to specify, and add into the coherency rule table of the real connections, a functional adapter block inserted into the connection in question.

According to another characteristic of the system, the component and connection rule table, which includes the properties of the components, contains global parameters common to all of the component types and exists in the form of a table distributed into one or more tables, which may or may not be associative, wherein the entries are names designating all of the possible models for the same component.

According to another characteristic of the system, the associative tables can contain the description, either in the form of parameter sets or in the form of references to procedures that generate the required values, the entries of these associative tables being names designating all of the possible models for the same component and forming a character string containing predetermined special identifiers, replaced by the values calculated by the Configurator system.

According to another characteristic of the system, at least three selectors indicate the instance to be used, the latter being transmitted as a parameter to a constructor of an HLL object.

a first selector indicates the current instance, a second selector specifies the instance connected to the other end of the port, a third selector indicates the composite instance corresponding to the active Component containing the observation port.

According to another characteristic of the system, the Configurator system uses one or more connection coherency rule tables, which represent the rules for interconnecting the components and for inserting intermediate components, one or more component and connection rule tables, which represent the system-level connection rules and the rules for generating connections between the signals, and one or more source file formatting tables, which represent the rules for generating instances of HLL-type objects.

According to another characteristic of the system, the Configurator system uses:

an HLL base class for uniquely identifying each object instantiated and for polling the configuration;

a means for generating and automatically instantiating System Blocks;

a means for generating tables associating the signals connected together under the unique name of the connecting wire; and a means for using a formatting table to generate the source files in HDL and HLL.

According to another characteristic of the system, an operator functionally specifies the configuration in the highest level language as much as possible, and completes the functional specification with the components in the lowest level language.

According to another characteristic of the system, the following entries in the hash define the component Type (for example DUT (HDL model), XACTOR (transactor), MONITOR, VERIFIER or other types), and correlate each Component Type to a hash, in turn composed of the following entries:

a first entry ReqModule contains the name of the HDL module of the component and the name of the corresponding source file, a second entry Connect is the definition of the method for selecting the signals that are part of a Port, this description being composed of a set of entries indexed by the name of the Port; the Configurator associates each Port name with a table of regular expressions and a pointer to a signal connection procedure that controls the application of these expressions to the names of the signals of the interface of the component.

According to another characteristic of the system, the generic structure of the active Components includes a Block containing the HDL description and a Block in HLL that provides the access paths to the HDL resources and, if necessary, a description of the block in HLL; the set of signals of the HDL block constitute the interface of the containing Block, formed by Ports, which are arbitrary logical selections of the signals of an interface, and by interface adapters, which are the software parts that handle, in each Port, the two-way communication between the parts in HLL and those in HDL, the interface adapters being chosen by the Configurator system.

According to another characteristic of the system, the Ports are specified in the form of regular expressions, which serve both to select the subsets of signals to be connected and to define the connection rules.

According to another characteristic of the system, the Configurator system generates so-called Transfer Components, which are inserted on each side of the cutoff to the servers, these components simply being wires for the inputs and registers for the outputs.

The elementary model components, which are shared among the Composite Model Components or the Global Blocks belonging to the various servers, are automatically duplicated by the Configurator system and instantiated in each server.

BRIEF DESCRIPTION OF THE DRAWINGS

The invention will be better understood with the help of the following description of a preferred embodiment of the method of the invention, in reference to the attached drawings, in which:

FIG. 1 represents, in highly schematic form, an exemplary architecture of the global simulation model for an integrated circuit (ASIC) under development, called BRIDGE (12);

FIGS. 3a through 3c represent various stages in the modeling of a circuit using a mixed HDL (VERILOG or VHDL) type and the HLL (C++) type mode;

FIG. 4 represents the generic structure of an elementary Model;

FIG. 5 represents the generic structure of a Composite Model;

FIG. 6 describes the correspondence between the tables of the description of the configurator system in FIGS. 2a through 2d and the tables for implementing the method of the invention;

DESCRIPTION OF THE PREFERRED EMBODIMENTS

The invention concerns a system called a "Configurator," and the configuration method implemented by the system.

A global simulation model is typically composed of one or more models of integrated circuits under test (DUTs) surrounded by models that create a test and verification environment. These models create complex stimuli and receive complex responses from the model being tested. These components can be transactors (XACTORS)—models that generally have an application programming interface (API) that permits control by tests outside the model, these tests generally being written in a high level language (HLL).

The verification environment can also contain components called Monitoring Blocks (MONITOR) and components called Verification Blocks (VERIFIER). These components are not directly involved in the exchange of signals between the other components of the global simulation model, but are used to observe and interpret them. The Monitoring Blocks (MONITOR) serve as analysis aids for the tests; they have program interfaces (APIs) for reporting events observed in the signals of the global model. The Verification Blocks (VERIFIER) are components that have a reference specification for the operation of the model being tested, and, by observing the signals of the global simulation model, they are capable of verifying the proper operation of the model.

Figure 8A:
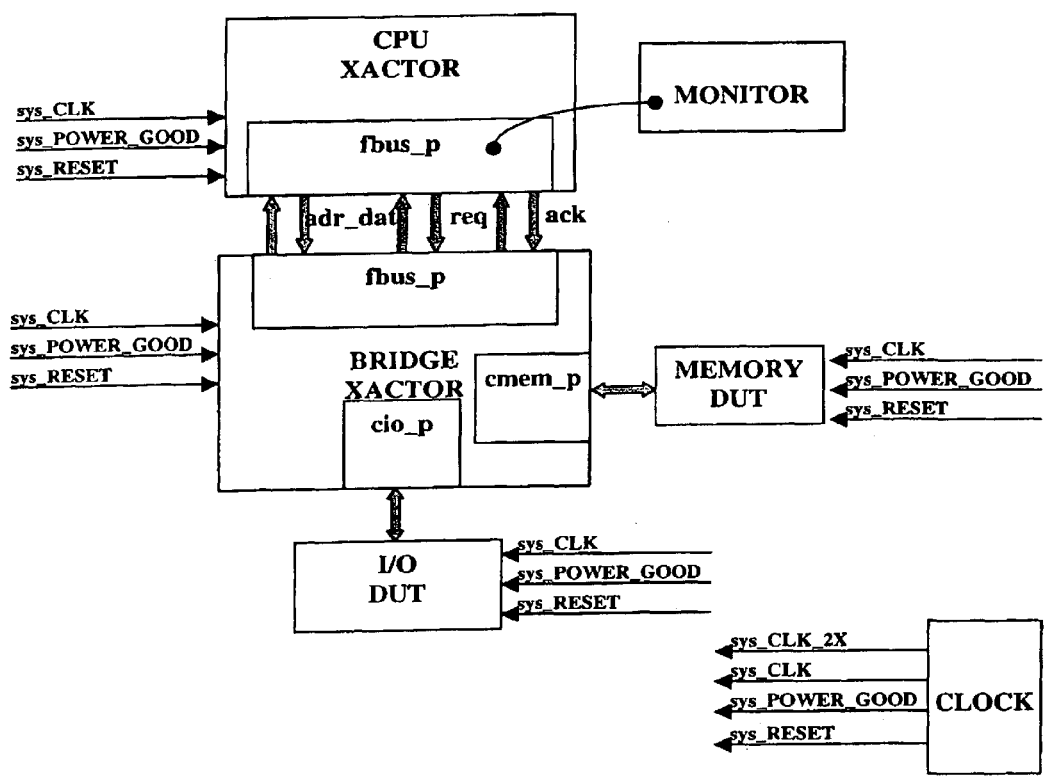
FIGS. 8a through 8e represent the successive configurations of the architecture that results in the creation of a given model, the final model of which corresponds to that of FIG. 8e, for which all of the HDL-type models of the circuit under design are available, this final model corresponding to the configuration.
Figure 8B:
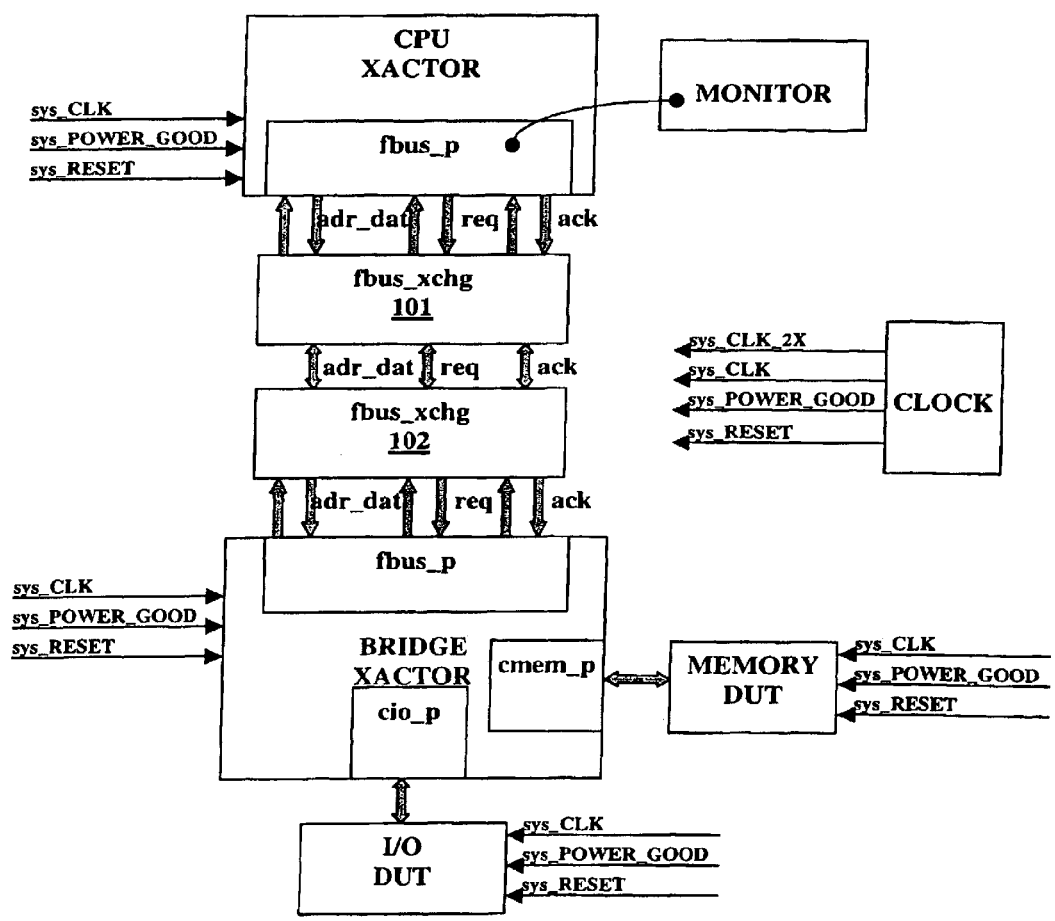
Figure 8C:
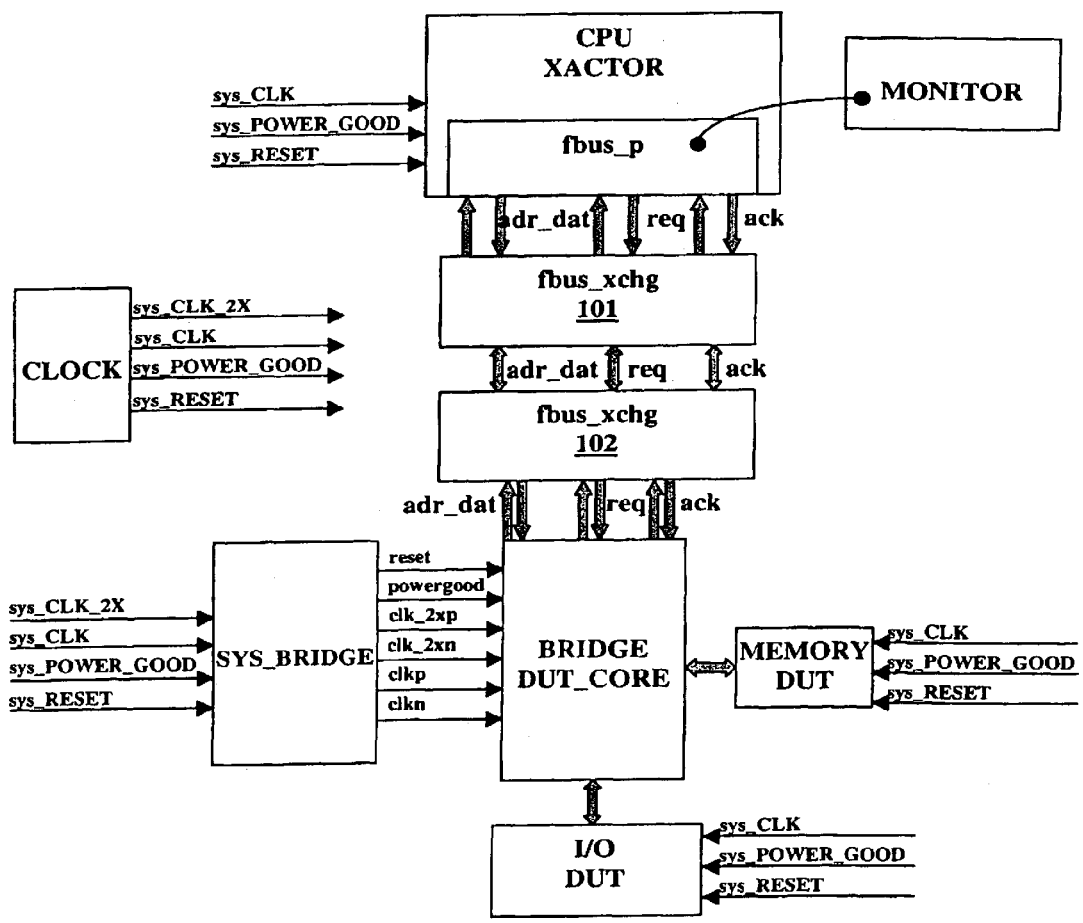

FIG. 1 represents an exemplary architecture of an integrated circuit system under development for which it is necessary, in a first step, to debug the global simulation model corresponding to FIG. 8c, chosen in order to illustrate the greatest number of mechanisms implemented by the Configurator. It should be clear that the steps in FIGS. 8a, 8b, could be executed first, depending on the availability of the models and the objectives of the verification. The final model desired is the one that corresponds to FIG. 8e. The architecture is constituted by a processor (CPU) communicating through a bridge (BRIDGE) with a system memory (MEMORY) and input/outputs (I/O). The model produced by the "Configurator" system of the invention is constituted by a processor component CPU of the XACTOR type, connected by an interface of the "fbus_p" type to an intermediate block (fbus_xchg) 101 having a different type of interface. Another intermediate block (fbus_xchg) (102), in FIGS. 8b and 8c, connects the first intermediate block (101) to a bridge-type component (BRIDGE) of the DUT_CORE type that communicates with a model, written primarily in an HDL-type language, of a memory (MEMORY) of the DUT type, with a model written primarily in an HDL-type language of an input/output (I/O) of the DUT type, and with a system block (SYS_BRIDGE).

The "Configurator" system of the invention handles the connection of software simulation elements called components for the purpose of simulating hardware circuits.

There are at least 5 classes of components:
"Active Components" (see below);
"Monitoring and Verification Blocks" (see below);
"Intermediate Blocks" (see below);
"System Blocks" (see below); and
"Global Blocks (see below and 1 of A2).

Each type of component can have several variants of embodiment of the same element, differentiated by the description level (see below) or by the signals in the interfaces (see below). Each type of component can be described in several levels of detail (functional, behavioral, gates, etc.), in an HDL-type language like VERILOG or VHDL, or in a high level language (HLL) like C or C++, complemented by an HDL-type interface.

Several description levels for describing similar functionalities can coexist and can have HDL-type interfaces that are similar but not necessarily identical. Certain descriptions can have more functionalities, and the HDL-type interfaces can contain completely different sets of signals.

The components are connected based on a predetermined schema that is considered to be fixed for each execution of the Configurator system. These connections are defined by the architecture of the global simulation model and specified by the architecture description file (FDARCH) (see Appendices A1-A5).

Each instance of a component in this schema obtains a name or label that unambiguously identifies the position of the component and its type.

The definition file of the configuration (FCONF) provides a synthetic description of the Configuration variant to be generated by the Configurator system. Only the main components (Active Components, Monitoring Blocks and Verification Blocks) are mentioned in it, along with the types of models desired. The other components (Global Blocks, System Blocks and Intermediate Blocks) are instantiated automatically by the Configurator system.

Among the various types of components, the "Active Components" constitute the subset of the objects explicitly designated in the configuration definition file (FCONF) that exchange stimuli with their environment by transmitting and receiving.

Among the various types of components, the "Monitoring and Verification Blocks" constitute the subset of the objects explicitly designated in the configuration definition file (FCONF) that merely receive information from the environment. They are used for purposes of observation and Verification (MONITOR, VERIFIER). The operation granularity of these models is the event, which reports changes in control signal values and arbitrary data exchanges.

All the other Components constitute so-called implicit components, which are managed and instantiated automatically by the Configurator system, as a function of the parameters of the configuration definition file (FCONF) (explicit component type, interface type, etc.).

The components can be connected to each other directly or via external adaptation components called "Intermediate Blocks," specially defined and declared for this purpose. They are often used, as will be seen below, during successive development phases to complete the missing parts of the design.

The Configurator system may thus insert one or more intermediate blocks to connect two active components.

The components called "System Blocks" are associated with the other components in order to supply them with the environment signals that are specific to them. These components encapsulate, at the level of each interface, all of the system signals that do not participate in the connection between the other components. The "System Blocks" themselves are connected to the "Global Blocks," and manage all of the environment signals, i.e., the clock signals and general control signals (clock, reset, powergood, diagnostic), which may be transformed in order to adapt them to the needs of the corresponding active block (polarity change, delay, etc.), as well as the specific signals that are different for each particular instance of the active component in question, for exampl; the signals that encode the module number or the operating mode of the component, etc. The latter are managed by parameters provided by the Configurator system to the instances of the models of the components generated. If, for a given Component, the System Block is not necessary (which is indicated by the description tables of the configuration), it will be connected directly to the Global Blocks (see 1 of A2).

The configuration definition file (FCONF) can contain additional information specifying intermediate blocks to be used in association with the instances of the active components. Thus, a user can influence the choice of the intermediate component, or eliminate the ambiguity if there are several possible choices. The connections thus obtained are compared to the connection coherency rule table (TRCOH) in order to detect any incompatibilities between the ends of the connections between the components, and in such a case to choose, and add into the instance connection table (TCINST), another adapter component (Intermediate Block), inserted into the connection in question.

The Configurator system is based on a generic representation, as described in FIGS. 3a through 3c, common to all of the components declared in the architecture description file (FDARCH) of the global simulation model and comprising two parts, of the HDL type (for example VERILOG or VHDL) and HLL type (for example $C^{++}$).

In the case of a component described entirely in an HDL-type language (FIG. 3a), the HLL-type part is reduced to one instance, which makes it possible to indicate its presence in the Configuration during the simulation and supplies the paths for access to the HDL-type resources of the component.

For components described in an HLL-type language (FIG. 3c), it is the HDL-type part that is reduced to a strict minimum and is limited to the description of the interface registers and signals.

All of the intermediate levels between these two extremes are possible, and are naturally used in the context of processes for developing ASIC circuits.

Typically, during development, one begins with an HLL-type model with a minimal HDL-type interface, then moves on to increasingly complete HDL-type models written by the designers, and ends up with models on the logic gate level that are automatically synthesized from HDL-type models.

Mixed models are often used because they allow for a precise and efficient simulation by dedicating the high-level language (HLL) to complex modeling for which the HLL-type language offers a compact and quickly executed solution. Nevertheless, even for models written primarily in an HLL-type language, the HDL-type part can be non-trivial because of performance losses due to changes in the simulation context between the HDL-type and HLL-type parts, respectively. A typical example is an interface whose signals change, even without any real data transfer activity. In this case, it is preferable to process the signals in the HDL-type part of the model, and to switch to the HLL-type part when the data are present in the interface.

The interface of a component is the set of all the signals present on its periphery. For components described in an HDL-type language only, this corresponds to the external interface of the definition of this component in an HDL-type language (for example VERILOG or VHDL). For components defined in a mix of HLL- and HDL-type languages, the interface of a component is the sum of the signals of all the HDL-type models used on the periphery of this component.

FIG. 4 describes the generic structure of the elementary models that constitute the majority of the components. This structure typically, though not exclusively, applies, in the case of the ASIC circuit under development, to interface adapters, intermediate blocks, and system blocks.

It includes a containing block, marked C, containing the HDL-type description marked A, and the HLL Block marked B that provide the paths for access to the HDL-type resources and, if necessary, a description of the block in an HLL-type language. The set of signals of the HDL-type block constitutes the interface of the block C. For purposes of connecting between the blocks, we will use the concept of Ports (see below), which are arbitrary logical selections of the signals of an interface. It is possible for a signal to belong to several Ports at once.

The Configurator system is capable of handling so-called "composite" models comprising a part in an HLL-type language and including other models of components called "interface adapters." Interface adapters are mixed HDL/HLL-type models having an application programming interface (API) in an HLL-type language through which they communicate with the composite model. Composite models are particularly useful for simulation environment components (for example MONITOR, VERIFIER, XACTORS) wherein the model must adapt to signals present in the different variants of the models used in a configuration.

FIG. 5 describes the generic structure of composite models, used especially for modeling the components of the simulation environment. Seen from outside, the composite model is identical to the elementary model. Inside, the HLL specification of the model (marked D) communicates with the external HDL-type interface through interface adapters (marked C_Port$_i$), modeled by means of elementary structures in an HLL-type language (marked B_PORT), and in an HDL-type language (marked A_PORT).

The Configurator system is equipped to automatically select the interface adapters for a composite model. The Configurator system examines the list of usable interface adapters for a given composite model described by the properties of the model, and chooses the interface adapter model whose physical connections with the rest of the global model conform to the connection coherency rule table (TRCOH). This approach makes it possible to quickly adapt to new types of interfaces by adding new adapters.

It is important to emphasize that the same component can be modeled by either an elementary or a composite structure, depending on its description level.

An interface adapter component can be shared among several composite models connected to the same port. Only one of these models is authorized to transmit signals to the port, the other models being purely observers. A typical utilization involves the Monitoring and Verification Blocks, which do not send output signals. The sharing of the interface adapters speeds up the simulation by simplifying and factoring parts of the model.

Hereinafter, the interface adapters that observe the signals on behalf of the Monitoring or Verification Blocks that are Composite Models will be called Probes.

The Configurator system is designed to optimize the utilization of Probes, while keeping their numbers to a minimum. Since the description of the Components establishes the notion of equivalency between certain Components, the Configurator system first tries to share the port of an "Active Component." If this proves impossible, it instantiates a suitable Probe component that can be connected to the HDL-type interface from a list provided in the description of the Monitoring or Verification Component.

The section below explains the definitions related to the connections between Components. the concepts of interfaces and ports are used to support the description of the connections between the components.

A port is an arbitrary selection of signals of the HDL-type interface of a component, performed using regular expressions based on the names of these signals. A given signal can belong to one or more ports. The definition of each port is comprised of pairs of regular expressions and corresponding substitute expressions. These expressions are successively applied to the name of each signal of the interface, and in case of an appropriate "match," the substitute expression is applied, and the name thus obtained moves on to the next substitution operation. If the final substitution gives a final result that is identical for two signals, they will be connected to one another. The Configurator generates a unique name for the connection and places the appropriate information in the wiring table (TCAB). The method described makes it possible to express complex connection rules between two components. For example, it is possible to connect signals with different names, or to create rules for connecting the input signals with the output signals.

The creation of this method for definition by the interfaces and the ports makes it possible to separate the declarations of HDL-type models and the specifications of connections for the Configurator system. The latter combines these two sources of information in order to generate the connections. In the majority of cases, modifying declarations in the HDL-type parts, which happens quite frequently during development, does not entail any modifications in the regular expressions that describe the wiring.

In the exemplary embodiment of the invention discussed below, only the point-to-point connections are described. The "bus"-type connections are easily modeled using a component with several outputs incorporating the bus.

The method of automatic connection between the components by the Configurator system in order to create the global simulation model will be described below. This method comprises the following steps:

reading the architecture description file (FDARCH) of the global model and storing, in a component and connection rule table, in a connection coherency rule table, and in a source file formatting table, the information related to all of the possible configurations, with each component obtaining a name that unambiguously identifies its position in the architecture, and a type from among several types (Active Components, Monitoring and Verification Blocks, Intermediate Blocks, System Blocks and Global Blocks);

instantiating the components specified in the configuration definition file by the user-developer using a list of the components present, designated by their names and types and including parameters or invoking procedures, the configuration definition file comprising a file from which to select the components and their types and optional additional indications concerning the type of interface and the server involved in the configuration to be generated by the Configurator, and storing the corresponding information in an instance connection table;

topologically connecting the instances based on the schema defined by the component and connection rule table (TCRC).

reading and storing the HDL-type sources of the models instantiated, in order to extract the names and types of the interface signals from them;

wiring the interface signals, at the level of each instance of the components by applying regular expressions, stored in the component and connection rule table (TCRC), based on the names of the signals constituting the wiring table (TCAB); and using the instance connection table (TCINST), the wiring table (TCAB) and a formatting table (TFMT) to automatically generate the HDL-type (MGHDL) and HLL-type (MGHLL) source files of the global simulation model corresponding to the configuration specified by the configuration definition file (FCONF).

The topological phase proceeds in the following way:

The explicit components specified in the configuration definition file (FCONF) are instantiated by the Configurator system and placed in the instance connection table (TCINST). This table contains the description of each instance (label, type), accompanied by a list of the components with which it is connected;

the Intermediate Blocks, explicitly specified in the ports of the "Active Components" in the configuration definition file, are instantiated and added to the instance connection table (TCINST);

the connections between the active components instantiated are compared with the rules contained in the connection coherency table (TRCOH) in order to detect any incompatibilities between the ends of the connections between the components, and in that case to choose, and add to the instance connection table (TCINST), an adapter component (Intermediate Block) to be inserted into the connection in question;

the components of the Monitoring Block and Verification Block type are instantiated. The Configurator system analyzes the connections of the composite model components and searches for sharable interface adapters at the level of the common ports (see the models C_Port, in FIG. 3). If there is no suitable component with which to share the connection by observing the required signals, an interface adapter component with the properties specified by the description will be instantiated by the Configurator. The instance connection table (TCINST) is update; and the "system block" components are instantiated and placed in the instance connection table (TCINST) for the components that need them.

In the Wiring phase, the Configurator system connects the interface signals at the level of each port by applying regular expressions based on the names of the signals as described in the definition of the port. These expressions are applied to the names of the signals extracted from the HDL-type descriptions of the components, so any changes in the HDL-type interfaces from one version of a model to another do not directly affect the specifications of the connections between the blocks. This phase results in the generation of the wiring table (TCAB), which associates the signals connected to one another with the unique name of the wire that connects them. A certain number of verifications are then possible, for exampl; on the sourceless connections, the connection of several outputs, or other connections.

The various steps in the wiring phase are the following:

the Global Components and System Blocks are wired to all of the components;

the signals between the other components are wired; and an additional pass is performed to determine if it is possible to connect the signals of a component not connected in previous wiring phases to the corresponding signals of the system block, this pass is specially provided for forcing known and stable values that inhibit the unused ports. The signals in question of the system blocks carry a special marking (for example a special prefix in the name) so as not to be connected during the previous wiring phases.

In the source file generation phase, the Configurator system generates the HDL-type and HLL-type source files based on the content of the instance connection table (TCINST), the wiring table (TCAB) and the formatting table (TFMT), in order to automatically generate the HDL-type (MGHDL) and HLL-type (MGHLL) source files of the global simulation model corresponding to the configuration specified by the configuration definition file (FCONF).

The HDL-type source file contains a description of the HDL-type part (for example in VERILOG) of the global simulation model corresponding to the configuration definition file (FCONF). In particular, it contains the instantiation of all of the HDL-type models of the components mentioned in the configuration file, the intermediate blocks, System Blocks and Global Blocks, as well as all of the wires connecting these instances.

The HLL-type source file contains the program that corresponds to the instantiation of all the components having part of their models in an HLL-type language. In the case of object-oriented HLL languages, the code contains the constructors of HLL class objects with the corresponding parameters specified in the description of each component. A formatting table (TFMT) specific to each design makes it possible to generate the appropriate HLL-type code.

The architecture description file (FDARCH) for a specific implementation of the Configurator system (PROGCONF) is described below in the PERL language. PERL was chosen because of its direct manipulation of regular expressions and associative tables on several levels.

The architecture, represented in FIG. 1, is constituted by a processor (CPU) communicating through a bridge (BRIDGE) with a system memory (MEMORY) and input/outputs (I/O).

In order to facilitate its writing and manipulation, the file FDARCH represented has been divided into several parts, presented in Appendices A1 through A5. This file defines the architecture of the global simulation model corresponding to the generic diagram represented in FIG. 1. The HDL-type language generated is VERILOG and the high level language (HLL) generated is $C^{++}$.

The properties of the Components (type, HDL-type interfaces, ports, constructors of objects of the $C^{++}$ class, etc.) are described in several tables written in PERL language. The correspondence between these tables and the diagram illustrating the Configurator system of FIG. 2 is represented in FIG. 6. In the description below, all of the notations beginning with "% . . . " correspond to hash tables. These tables can contain the description, either in the form of parameter sets or in the form of references to procedures that generate the required values.

The procedures are part of the description and are changed for each design. The typical example of their utilization is the generation of interconnections between the components. Often, a table corresponding to all of the possible interconnections would be too large and difficult to generate and maintain. A procedure, on the other hand, can be very compact.

The description of the rules for interconnecting the components (TCRC) contains global parameters common to all of the component types. It can exist in the form of at least one table. In the exemplary embodiment of FIG. 6, it is shown in the form of seven associated (hash) tables, three of which have the entries (% InstNameModuleMap, % SysConnectMap, % SysSpecMap), the names designating all of the possible models for the same component:

The table "% InstNameModuleMap" (see 2 of A1), which appears in the file patent_config_defs.pm for describing the explicit components. This table represents the rules for generating connections between the signals. It has the entries Connect and SelfConnect.

The table "% SysConnectMap," which appears in the file patent_Sysconfig_defs.pm for the System Blocks.

The table "% SysSpecMap," (see 4 of A2), which appears in the file patent_Sysconfig_defs.pm for the Intermediate Blocks.

The two hash tables % SysWrapMap and % SysPinConst (see 6 of A2) contain the system level connection rules. The hash table % Activity-TypeMap associates the name of a component with its type. The hash table % PortProbeMap has as entries the names of the HDL-type models used in the description of the components.

The Configurator system is controlled by at least one connection coherency rules table (TRCOH), which represents the rules for interconnecting between the components and inserting intermediate components. In the embodiment of FIG. 6, the connection coherency rules are distributed in the form of the following two tables:

% HwfConnectivityMap (see. 2 of A2)
% HwifAlternateMap

The Configurator system is controlled by at least one source file formatting table (TFMT), which represents the rules for generating instances of HLL-type objects. In the embodiment of FIG. 6, the rules for generating instances of HLL-type objects are distributed in the form of the following two tables:

% moduleToCppClassMap (see 1 of A5)
% classCppProtoMap (see. 2 of A5)

The role of each of these hash tables is described in detail below.

Among the entries defined for the tables % InstNameModuleMap, % SysConnectMap, % SysSpecMap, certain are mandatory:

The entry "MatchExpr," whose value is the regular expression that makes it possible to accept a name (label) of the component in the configuration file, is used to define the variants of the positions authorized for the component.

The entry "ExtrExpr," whose value is the regular expression that performs the extraction of the digital parameters from the name (label), is used for the instantiation of the Intermediate Blocks or the System Blocks or for generating the label of the implicit component.

Other parameters are optional and can be added to the description of the tables, but these parameters can only be used by the code provided with the description; among them are the following:

NumAdd, which is an auxiliary parameter serving as a modifier for the parameters extracted by ExtrExpr, used by the procedure GenDest (see below), and BaseIdExpr, which is a regular expression that makes it possible to find the active component corresponding to an intermediate or system component in case of ambiguity.

The following hash entries define the Type of the component, for example DUT (HDL-type model), XACTOR (transactor) or other types.

Each Component Type corresponds to a hash, in turn composed of the following entries:

ReqModule which contains the name of the HDL-type (VERILOG) module of the component and the name of the corresponding source file; and "Connect", which is the definition of the method for selecting the signals that are part of a Port. This description is composed of a set of entries indexed by the name of the Port. Each Port name is associated with a table of regular expressions and a pointer to a procedure for connecting the signals, which controls the application of these expression to the names of the signals of the interface of the component.

The Configurator has several preprogrammed procedures, but others can be added and referenced. The preprogrammed procedures accept the following modifiers:

E (exclusive—the signal will be used only once;
T (branch—the signal can be used by several destinations; and
A special value "filter_out_wire_name" assigned to a signal or a group of signals makes it possible to eliminate any connection to the corresponding signals.

The entry "SelfConnect"—similar to the entry "Connect"—contains the definitions of the connections of the Port signals that can be connected between two instances of the same component. This definition facilitates the connection of one-way output/input signals in the particular case of a head-to-tail connection.

The entry "Port" provides the definition of all of the ports. It is a hash that associates the name of each port with a table that includes the following elements:

the logical name of the HDL-type component;
the name of the HDL-type module or a choice of modules; and
the number of the port (useful for generating VERILOG and $C^{++}$ code).

The entry "GenDest" (see 1 of A3) is a pointer to the procedure that, for a component designated by a label and type, generates, for each port, the label of the component to which it is connected. The user must imperatively specify the referenced procedure; this procedure is also used to control the coherency of the requested configuration.

The entry "SysConn" is a hash that associates each HDL-type module contained in the model with a pointer to the procedure for selecting and naming the System Blocks. The user must imperatively specify the referenced procedure.

The entry "GenHDLInstParam" is a pointer to the procedure that generates the additional parameters required by the HDL-type simulator for the code generated, which instantiates the HDL-type part of the component.

The entry "CfgCpp" defines the parameters of the constructor of the object for the $C^{++}$ identification code of the Configuration, generated automatically, which serves as a filter for the selection of the Components by the Configurator system.

The first parameter is the name of the class of the $C^{++}$ object; it is a predefined name associated with that of the HLD-type model. The first parameter is followed by tables that correspond to groups of parameters typically associated with each port of the component. The keyword "Own" indicates an elementary model component.

Next comes the name of the HDL-type component referenced in the Port part and the type identifier of the component, for example DUT, model of the circuit under design, XACTOR, or transactor.

For the composite model blocks, the parameter part is richer.

It contains the keyword "Src" for the active components or "Mon" for the Verification and Monitoring components.

Next come the parameters of the interface adapter component, comprising:

the name of the HDL-type component; and
the identifier of the component type and its class followed by the name of the corresponding port.

The latter parameters are specific to each port of the composite block.

In the $C^{++}$ code generated for a composite model, the parameters transmitted to the constructor of a class correspond to the pointers to the instances of the interface adapters.

All of these parameters serve to guide the generator of the $C^{++}$ code, which combines them with the rules contained in the hash table "% classCppProtoMap":

the entry "ProbeConnect" associates each port of a Monitor or Verifier component with the $C^{++}$class that is acceptable as an interface adapter. Thus, the Configurator is capable of optimizing the code by using the same interface adapter for several components (composite model); and the entry "SysWrap" is a hash that, for each HDL-type part of a component, defines the regular expression to be used for setting the remaining unconnected signals to a known state after the wiring between the components.

The following algorithm is used for connecting two components:
- the Configurator system attempts direct connection,
- if direct connection proves impossible based on the first hash table % HwfConnectivityMap, the modules specified in % HwifAlternateMap are retrieved in order to be placed in the component. The optional modules are indicated by the character ">" at the beginning of their name in the specification of a component.
- in the end, if no module works, the Configurator system returns to the hash % HwfConnectivityMap to choose the intermediate blocks to be placed between the components; and
- if no suitable block is found, an error is signaled.

The user can influence the Configurator system's choice by explicitly specifying in the configuration file the intermediate blocks to be connected to a component.

The table "% HwfConnectivityMap" allows for both the Verification of connectivity and the specification of intermediate Blocks to be inserted in order to connect two Components whose parts are not directly connectable.

In order for two blocks to be able to be connected to each other, it is necessary for % HwfConnectivityMap to contain entries that describe the following properties of this connection:
- each component is associated with the component to which it can be connected;
- a direct connection is indicated by the value "Direct";
- for connections requiring an intermediate Block, the name of this block is Indicated; and
- for certain blocks, the connectivity can be specified differently for each port of the block. This serves to eliminate the ambiguity in the connections of a block. A typical utilization involves the insertion of two intermediate blocks connected head-to-tail between two explicit components.

It is emphasized that the connectivity in this case is expressed globally, without specifying the names of signals to be connected.

The Components described in an HLL-type language can have several possible implementations of the HDL-type modules A_Port, at the level of each port i (see FIG. 3). The hash table "% HwifAlternateMap" specifies the choice that is possible for each HDL-type module of a component. The Configurator system uses this information in order to insert the intermediate blocks only when strictly necessary.

The hash % SysWrapMap defines, for each implementation of a component, its System Block. The entries are names of HDL-type modules associated with the name of the system block and its HDL-type implementation. This information is used by the Configurator system to instantiate the appropriate system block from specifications contained in the hash % SysConnectMap (see 3 of A2).

The hash % SysPinConst associates, with each System Block, the connections of certain signals of its interface to the names of the corresponding signals (wires) at the system level. These connections are independent of the configurations and are not governed by the regular expressions that are applicable during the wiring of the other signals.

Typically, the signals in question are clock signals, reset signals, etc. The referenced names are declared in an HDL-type code that is specific for each model under design, and are provided by the user (in the form of a variable or a file) with the descriptions of the components and the specific connection rules.

This specific HDL-type code is systematically included at the beginning of the HDL-type code generated by the Configurator system.

The procedure "&gen_sys_VlogInstParameter" is a procedure that generates the instantiation parameters for the generator of the HDL-type code from the label and of the type of each Component.

The hash % Activity_TypeMap (see 1 of A1) associates the name of a component with its type, specified by one of the following keywords:
- "actor" for the Active Components;
- "spectator" for the Monitoring blocks;
- "checker" for the Verification blocks; or
- "helper" for the System blocks or the Intermediate blocks in case of an indirect connection.

The table "% PortProbeMap" is a hash whose entries are the names of the HDL-type models used in the description of the components. The values are in turn hashes that associate, with each port name, a table containing the name of a block that can serve as a Probe for observing the signals of this port and the name of the corresponding $C^{++}$ class. This hash informs the Configurator system of the type of component capable of observing the signals of a given port and the type of $C^{++}$ API that can be used to analyze the control and data flow observed in this port.

The procedure &GenDest accepts as input the label of the source component, its type and its port. The result returned is a hash that associates the label of the connected target component with its port.

In order to control the coherency of the configuration generated no matter what the order in which the Components are handled, the Configurator system calls the procedure &GenDest with the parameters obtained for the target component used as a source and verifies that the result actually corresponds to the initial source component and port.

The Configurator system calls the procedure &GenDest for each component contained in the configuration file, running through all of these ports.

The hash returned by &GenDest can contain several components with their respective ports. This is particularly the case for connections of the "bus" type; &GenDest returns all of the components connected by the busses except the one that is given as an argument. The Configurator system automatically inserts the necessary "bus" component.

The hash &moduleToCppClassMap is a search accelerator that makes it possible to retrieve the $C^{++}$ class from the name of the HDL-type module; it only applies to elementary Models (see 1.14).

The hash % classCppProtoMap describes the generation of the constructors of $C^{++}$ class objects. Each entry corresponds to the name of a $C^{++}$ class. Each description is a hash composed of the following four entries:
- "Prea", which corresponds to the generation of the first part of the constructor (class, name of the instance, first parameters);
- "Iter" which corresponds to the iterative part of the parameters of the constructor. This rule is applied for each element contained in the entry CfgCpp of the description of the component;
- "Post", which corresponds to the last part of the constructor (last parameters, closing parentheses; and
- "Idle", which is a rule that substitutes for the rule "Iter" for nonexistent connections (partial configurations). Typically, a null pointer or null string is generated.

Each entry is a character string containing predetermined special selectors, replaced by the values calculated by the Configurator system. These selectors have the general form

<Src:Dst:Act><Item#≧, where "Src," "Dst" and "Act" indicate the instance to be used, the latter being transmitted as a parameter to a constructor of an HLL object.

"Src" indicates the current instance;
"Dst" indicates the instance connected to the other end, of the port, and
"Act" indicates the composite instance corresponding to the Active
Component containing the observation port.
<Item> is a keyword indicating the selection of one of the following:
"Inst" for the instance name cpp;
"lid" for the component label corresponding to Inst;
"Ict" for the component type (DUT, VERIFIER, XACTOR, Monitor, etc.); or
"Port" for the name of the port.

The two variables "$cpp_preamble" (see 3ofn A5) and "$cpp_postamble" (see 4 of A5) respectively contain the beginning and the end of the C++ program text generated by the Configurator system. The text generated from the table % classCppProtoMap is inserted in the middle.

The two variables "$top_verilog_preamble" and "$top_verilog_postamble" respectively contain the beginning and the end of the text of the instance "top" of the HDL-type (VERILOG) description of the configuration. Typically, they are the instantiations of clock blocks and other system level blocks.

The description that follows is a simple example of the generation of a Configuration through the implementation of the Configurator system, which is illustrated in a simplified case based on the architecture of a System constituted by a bridge (BRIDGE) that connects a central processor (CPU), a Memory, and an input/output card (I/O). The Architecture of the System is represented in FIG. 1.

In this example, the CPU and the BRIDGE can be modeled, either by a VERILOG model of the design (DUT, DUT_Core), or by a C++ composite model (XACTOR).

The interface between the CPU and the BRIDGE is called FBUS. Several variants of this interface are considered to correspond to successive stages of development.

The global block Clock handles the distribution of the clock signals and system signals globally for all of the Components.

The Configurator system relies on the description of the HDL-type Interfaces of the Components. Simple interfaces, written in VERILOG language, are proposed below as examples for each of the Components. The Configurator system analyzes only this part of the source files contained in the library of HDL-type source files (BFSHDL). They belong to a methodology for progressively handling variants of models as they become available.

The following HDL-type description of the Interfaces has been reduced to only what is necessary to illustrate the capabilities and the operation of the Configurator. In a real situation, the behavioral descriptions are included, as in the case of the model of the clock (the module CLOCK).

Figure 7A:
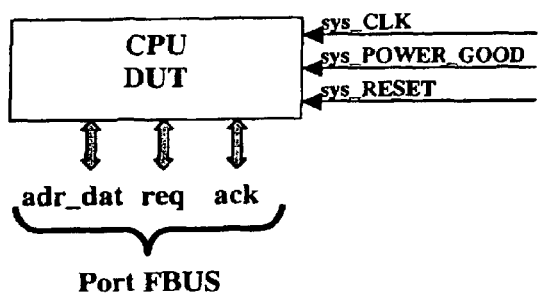
FIGS. 7a through 7k schematically represent the various models of the components with the necessary variants of their interfaces and description levels for the configurations related to the architecture in the example of FIG. 1.

The description is as follows:
CPU:
a) The model DUT of the component CPU (FIG. 7a) has a port FBUS for connecting with the BRIDGE, as well as a set of System signals, defined below.

Figure 7B:
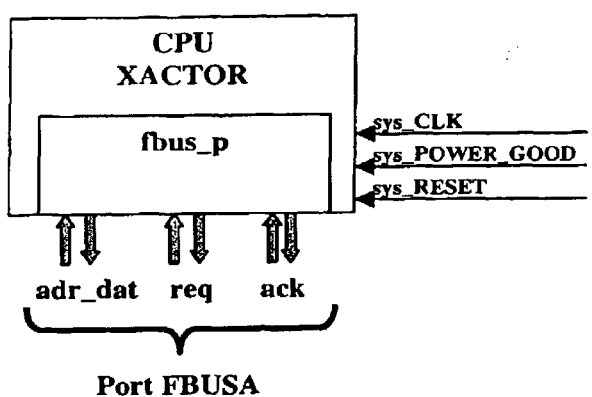

```
module cpu (
    XXadr_dat,
    XXreq,
    XXack,
    //
    clk,
    reset,
    powergood
    );
inout   [63:0] XXadr_dat;
inout   [3:0] XXreq;
inout   [3:0] XXack;
input   clk;
input   reset;
input   powergood;
endmodule
``` b) The model XACTOR (FIG. 7b) consists in an abstract C++ model whose HDL-type instance is constituted by that of the Port named fbus_p. In this example, it is assumed that the Port FBUS has a variant named FBUSA wherein the two-way signals adr_dat have been separated into pairs of one-way in (inXXadr_dat) and out (outXXadr_dat) signals.

Figure 7C:
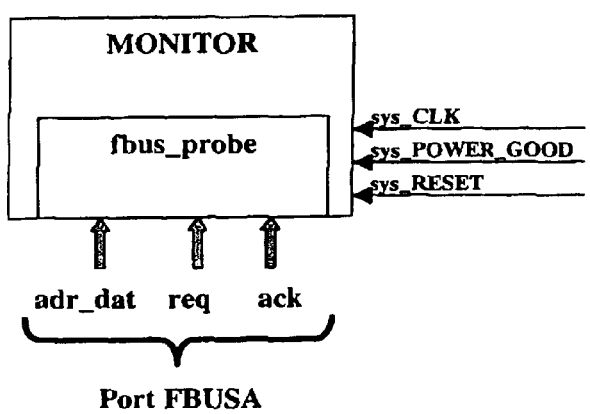

```
module fbus_p (
    inXXadr_dat,
    outXXadr_dat,
    inXXreq,
    outXXreq,
    inXXack,
    outXXack,
    //
    clk,
    reset,
    powergood
    );
input   [63:0] inXXadr_dat;
output  [63:0] outXXadr_dat;
input   [3:0] inXXreq;
output  [3:0] outXXreq;
input   [3:0] inXXack;
output  [3:0] outXXack;
input   clk;
input   reset;
input   powergood;
endmodule
``` c) The model MONITOR of the component CPU is a composite model that allows the Monitoring of the interface FBUS. In the case where there is no port adapter fbus_p in the configuration, a probe containing the instance fbus_probe will be generated (FIG. 7c).

```
module fbus_probe (
    XXadr_dat,
    XXreq,
    XXack
    //
    clk,
    reset,
    powergood
    );
input   [63:0] XXadr_dat;
input   [3:0] XXreq;
input   [3:0] XXack;
input   clk;
input   reset;
input   powergood;
endmodule
```

Intermediate adaptation blocks FBUS:

These blocks implement the interface adaptation at the FBUS level in the case where point-to-point mapping of the signals is impossible. The port FBUSA is the variant of FBUS in which the two-way signals have been separated into pairs of one-way incoming (in) and outgoing (out) signals.

Figure 7D:
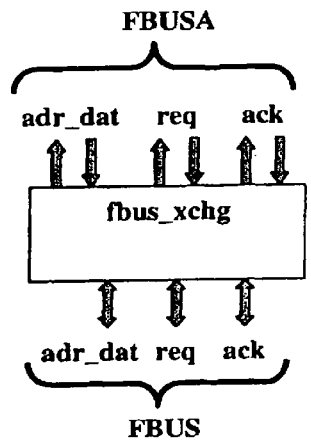

The model fbus_xchg (FIG. 7d) implements the adaptation between the interface FBUS of the port fbus_p and that of a port FBUSA; the width of the interface can be parameterized so as to accommodate potential technological evolutions.

Figure 7E:
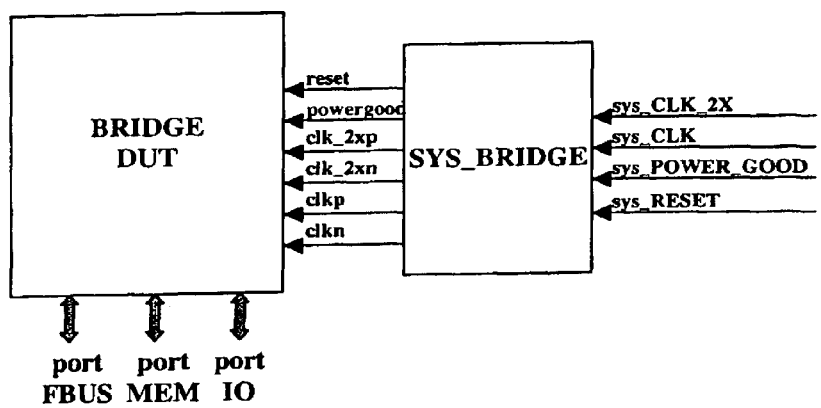

```
            module fbus_xchg (
                    XXadr_dat,
                    XXreq,
                    XXack,
                    //
                    inXXadr_dat,
                    outXXadr_dat,
                    inXXreq,
                    outXXreq,
                    inXXack,
                    outXXack,
            );
            inout   [63:0] XXadr_dat;
            inout   [3:0] XXreq;
            inout   [3:0] XXack;
            //
            input   [63:0] inXXadr_dat;
            output  [63:0] outXXadr_dat;
            input   [3:0] inXXreq;
            output  [3:0] outXXreq;
            input   [3:0] inXXack;
            output  [3:0] outXXack;
            // model body
            endmodule
                BRIDGE:
``` a) The model DUT of the component BRIDGE (FIG. 7e) has the three respective ports to the models CPU, MEM and IO as well as the System signals delivered by the dedicated system block SYS_BRIDGE and by the global block CLOCK.

Figure 7F:
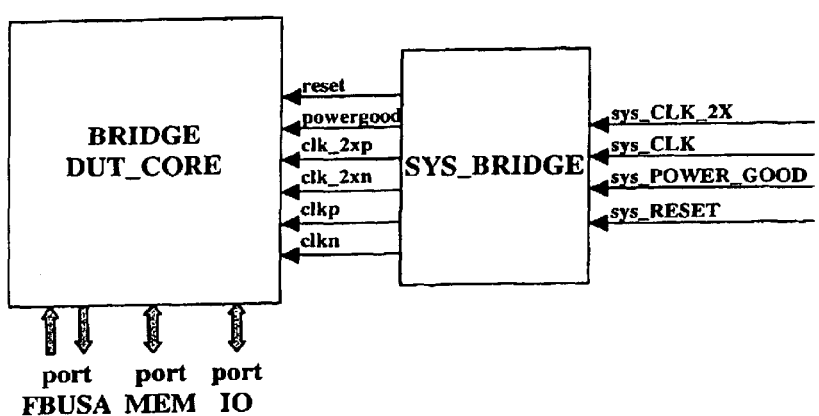

```
            module bridge (
                    XXadr_dat,
                    XXreq,
                    XXack,
                    YYadr,
                    YYdata,
                    ZZdata,
                    ZZreq,
                    ZZack,
                    YYctrl,
                    clk_2xp,
                    clk_2xn,
                    clkp,
                    clkn,
                    reset,
                    powergood
            );
            inout   [63:0] XXadr_dat;
            inout   [3:0] XXack;
            inout   [3:0] XXreq;
            output  [31:0] YYadr;
            inout   [63:0] YYdata;
            output  [2:0] YYctrl;
            inout   [15:0] ZZdata;
            input   [1:0] ZZack;
            output  [1:0] ZZreq;
            input   clk_2xp;
            input   clk_2xn;
            input   clkp;
            input   clkn;
            input   reset;
            input   powergood;
            endmodule
``` b) The model BRIDGE_CORE (FIG. 7f) is the variant DUT_CORE of the component BRIDGE having an interface FBUSA. This model reflects the situation in which the model of the FBUS interface controller is not available.

Figure 7G:
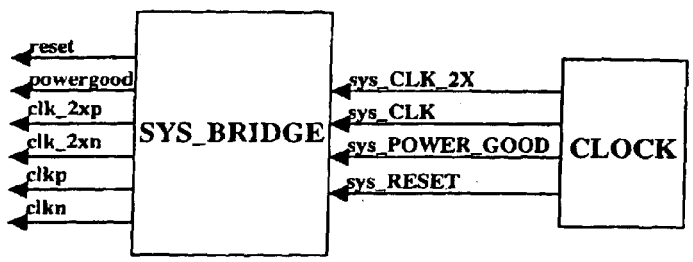

```
            module bridge_core (
                    inXXadr_dat,
                    outXXadr_dat,
                    inXXreq,
                    outXXreq,
                    inXXack,
                    outXXack,
                    //
                    YYadr,
                    YYdata,
                    YYctrl,
                    //
                    ZZdata,
                    ZZreq,
                    ZZack,
                    //
                    clk_2xp,
                    clk_2xn,
                    clkp,
                    clkn,
                    reset,
                    powergood
            );
            input   [63:0] inXXadr_dat;
            output  [63:0] outXXadr_dat;
            input   [3:0] inXXreq;
            output  [3:0] outXXreq;
            input   [3:0] inXXack;
            output  [3:0] outXXack;
            output  [31:0] YYadr;
            inout   [63:0] YYdata;
            output  [2:0] YYctrl;
            inout   [15:0] ZZdata,
            input   [1:0] ZZack;
            output  [1:0] ZZreq;
            input   clk_2xp;
            input   clk_2xn;
            input   clkp;
            input   clkn;
            input   reset;
            input   powergood;
            endmodule
``` c) The model sys_bridge (FIG. 7g) is the system block dedicated to the System signals of the Bridge model; it is fed directly by the block CLOCK.

```
            module sys_bridge(
                    clk_2xp,
                    clk_2xn,
                    clkp,
                    clkn,
                    reset,
                    powergood,
                    //
                    sys_CLK_2X,
                    sys_CLK,
                    sys_RESET,
                    sys_POWER_GOOD
                    );
```

-continued

Figure 7H:
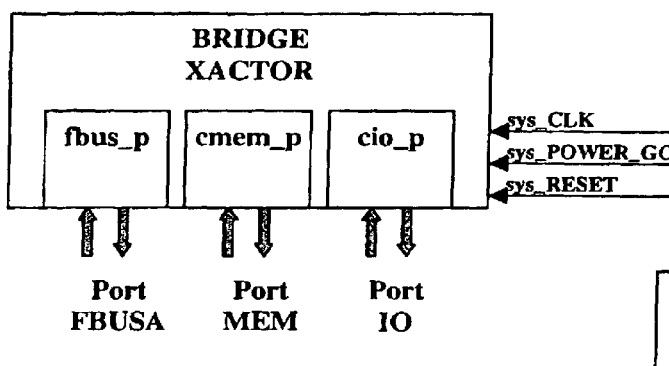

```
output      clk_2xp;
output      clk_2xn;
output      clkp;
output      clkn;
input       sys_CLK_2X;
input       sys_CLK;
input       sys_RESET;
input       sys_POWER_GOOD;
output      reset;
output      powergood;
clk_2xp = sys_CLK_2X;
clk_2xn = ~sys_CLK_2X;
clkp = sys_CLK;
clkn = ~sys_CLK;
reset, = sys_RESET;
powergood = sys_POWER_GOOD;
endmodule
``` d) The model XACTOR (FIG. 7h) is an abstract C++ model whose HDL-type instance is constituted by that of the various ports, respectively fbus_p, cmem_p, and cio_p, to CPU, MEM and IO.

```
module cmem_p (
            YYadr,
            YYdata,
            YYctrl,
            clk,
            reset,
            powergood
            );
output      [31:0] YYadr;
inout       [63:0] YYdata;
output      [2:0] YYctrl;
input       clk;
input       reset;
input       powergood;
endmodule
module cio_p (
            ZZdata,
            ZZreq,
            ZZack,
            //
            clk,
            reset,
            powergood
            );
inout       [15:0] ZZdata;
input       [1:0] ZZack;
output      [1:0] ZZreq;
input       clk;
input       reset;
input       powergood;
endmodule
```

Figure 7I:
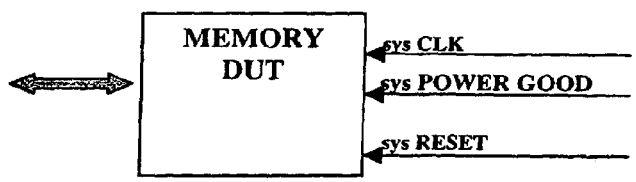

MEMORY:
The model DUT of the component MEMORY (FIG. 7i) has the respective ports to the models BRIDGE and CLOCK.

```
model DUT:
            module cmem (
                        YYadr,
                        YYdata,
                        YYctrl,
                        clk,
                        reset,
                        powergood
                        );
            input       [31:0] YYadr;
            inout       [63:0] YYdata;
            input       [2:0] YYctrl;
            input       clk;
            input       reset;
            input       powergood;
            endmodule
                                    I/O:
```

Figure 7J:
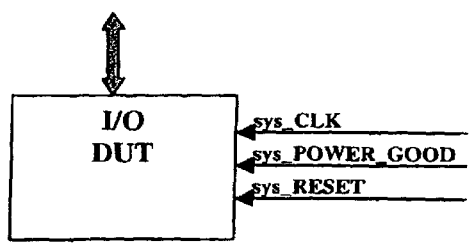

The model DUT of the component I/O (FIG. 7j) has the respective ports to the models BRIDGE and CLOCK.

```
model DUT:
            module cio (
                        ZZdata,
                        ZZreq,
                        ZZack,
                        clk,
                        reset,
                        powergood
                        );
            inout       [15:0] ZZdata;
            output      [1:0] ZZack;
            input       [1:0] ZZreq;
            input       clk;
            input       reset;
            input       powergood;
            endmodule
                                    Global System Block:
```

Figure 7K:
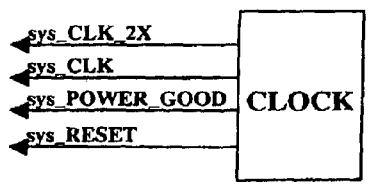

This model (FIG. 7k) handles the delivery of the System signals that feed the system blocks dedicated to each component.

```
module Clock (
                        sys_POWER_GOOD,
                        sys_RESET,
                        sys_CLK,
                        sys_CLK_2X
                        );
output sys_POWER_GOOD;
output sys_RESET;
output sys_CLK;
output sys_CLK_2X;
parameter HALF_PERIOD = 75; // 7.5 ns, 66 MHz
parameter RESET_DELAY = 10000000000 ; // 1.0 ms
parameter POWER_GOOD_DELAY = 5000000000 ; // 0.5 ms
initial begin;
sys_POWER_GOOD = 0;
sys_RESET = 0;
sys_CLK = 0;
sys_CLK_2X = 0;
#POWER_GOOD_DELAY sys_POWER_GOOD = 1;
#RESET_DELAY sys_RESET = 1;
end
always begin
#HALF_PERIOD sys_CLK = ~sys_CLK;
end
always @(posedge sys_CLK_2X) begin
      sys_CLK = ~sys_CLK;
end
endmodule
```

Definition of the configurations:

The configuration variants mark the various verification stages based on the availability of the models; the Configurator system generates the configurations unambiguously from topological information contained in the configuration file.

The first configuration is defined by the configuration file 1 below, represented in FIG. 8a; the models DUT of the CPU and the BRIDGE are not available.

Configuration file 1:
CPU_0 XACTOR
CPU_0 MONITOR
BRIDGE_0 XACTOR
CMEM_0 DUT
CIO_0 DUT The XACTOR CPU shares the port fbus_p with the MONITOR.

The second configuration is defined by the configuration file 2 below, represented in FIG. 8b.

The BRIDGE XACTOR is connected to the CPU XACTOR by an FBUSA-type interface specified in the configuration file by the attribute FBUSA=FBUS_xchg; the Configurator system automatically inserts the second adapter fbus_xchg 102.

Configuration file 2:

| CPU_0 | XACTOR | FBUSA = FBUS_xchg |
|---|---|---|
| CPU_0 | MONITOR | |
| BRIDGE_0 | XACTOR | |
| CMEM_0 | DUT | |
| CIO_0 | DUT | |

The XACTOR CPU shares the port fbus_p with the Monitor.

The third configuration is defined by the configuration file 3 below, represented in FIG. 8c; the BRIDGE DUT_CORE is connected to the CPU XACTOR by an FBUSA-type interface specified in the configuration file by the attribute FBUSA=FBUS_xchg; the Configurator system automatically inserts the second adapter fbus_xchg 102.

Configuration file 3:

| CPU_0 | XACTOR | FBUSA = FBUS_xchg |
|---|---|---|
| CPU_0 | MONITOR | |
| BRIDGE_0 | DUT_CORE | |
| CMEM_0 | DUT | |
| CIO_0 | DUT | |

The XACTOR CPU shares the port fbus_p with the MONITOR.

Figure 8D:
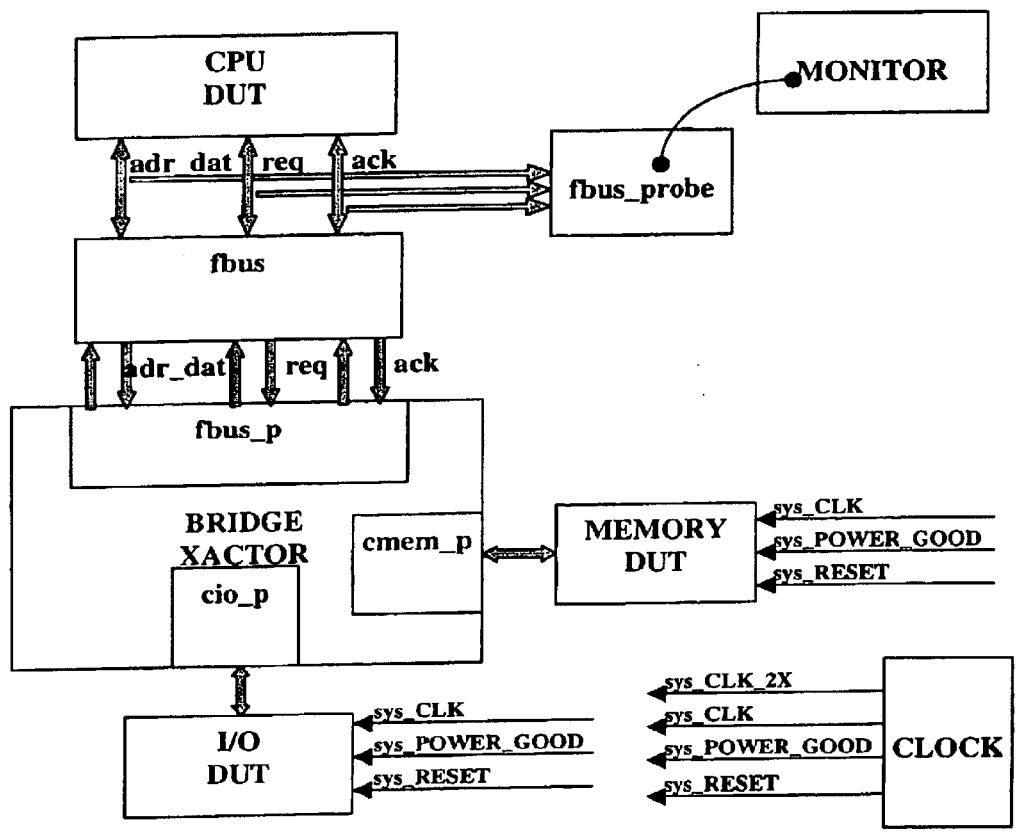

The fourth configuration is defined by the configuration file 4 below, represented in FIG. 8d; the model CPU DUT is connected to the model BRIDGE XACTOR. The Configurator system automatically inserts an interface adapter fbus for implementing the connection between the CPU DUT and the BRIDGE XAXTOR without any explicit mention of this block in the configuration file.

Configuration file 4:

| CPU_0 | DUT |
|---|---|
| CPU_0 | MONITOR |
| BRIDGE_0 | XACTOR |
| CMEM_0 | DUT |
| CIO_0 | DUT |

The Configurator automatically instantiates the Probe fbus_probe in order to allow the observation of the interface FBUS by the Monitor.

Figure 8E:
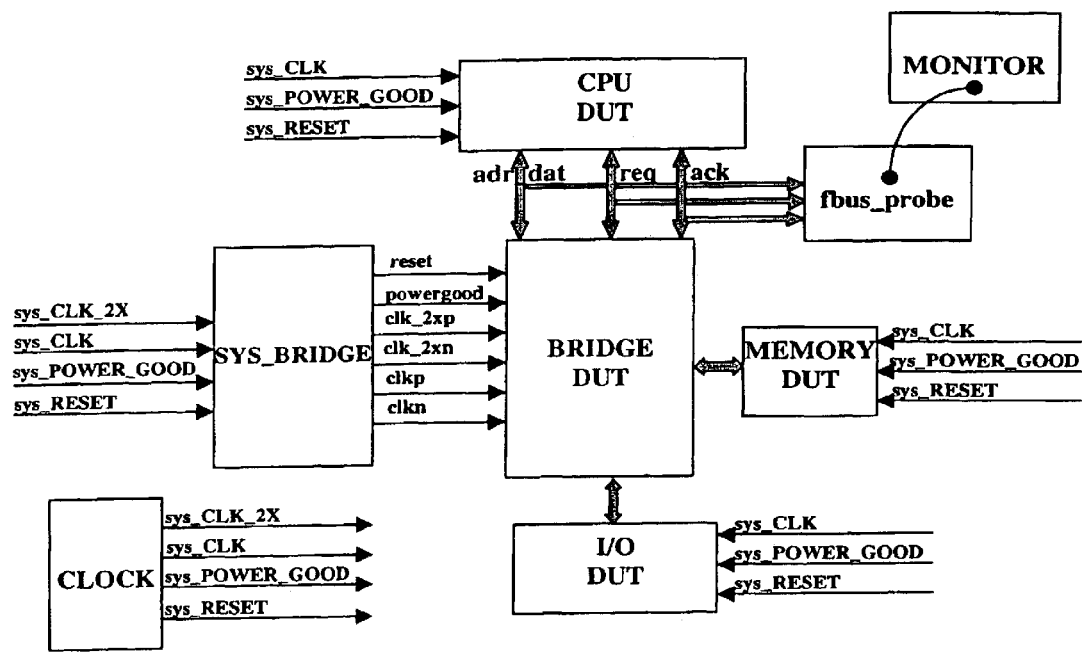

The fifth configuration is defined by the configuration file 5 below, represented in FIG. 8e; all of the models DUT are available.

Configuration file 5:

| CPU_0 | DUT |
|---|---|
| CPU_0 | MONITOR |
| BRIDGE_0 | DUT |
| CMEM_0 | DUT |
| CIO_0 | DUT |

The Configurator system automatically instantiates the Probe fbus_probe in order to allow the observation of the interface FBUS by the Monitor.

Figure 8F:
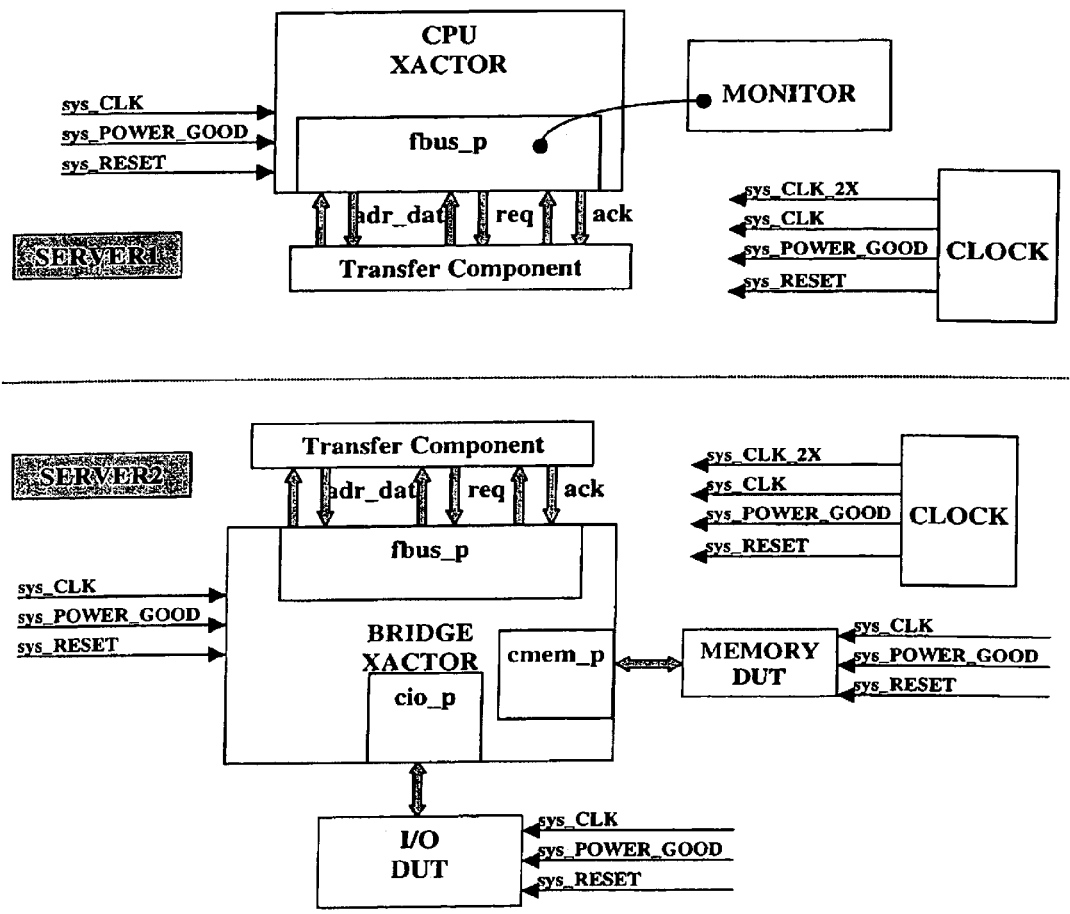
FIG. 8f represents the distribution of the simulation configuration of the model of FIG. 8a, for example into two machines.

The sixth configuration is defined by the configuration file 6 below, represented in FIG. 8f; it is a multi-server Configuration; Config1 is distributed between the 2 servers SERVER1 and SERVER2, the cutoff occurring at the level of the interface FBUS.

Configuration file 6:

| CPU_0 | XACTOR | SERVER1 |
|---|---|---|
| CPU_0 | MONITOR | SERVER1 |
| BRIDGE_0 | XACTOR | SERVER2 |
| CMEM_0 | DUT | SERVER2 |
| CIO_0 | DUT | SERVER2 |

The connectivity rules that make it possible to generate the connectivity tables of any configuration for this example are described in PERL language in Appendices A1 through A5.

Appendix A1 describes, in the case of the example chosen, the topological rules linked to the active components to be used by the Configurator system.

Appendix A2 describes the topological rules linked to the system Blocks and the Intermediate blocks to be used by the Configurator system.

Appendix A3 describes the procedures for connecting the Components to be used by the Configurator system.

Appendix A4 describes the code for generating the file in HDL-type language (Verilog_top.v) for connecting the components to be used by the Configurator system.

Appendix A5 describes the code for generating C++ Classes.

Appendices A6 and A7 describe the result files generated by the Configurator system, respectively in a low level HDL-type language (VERILOG) and in a high level language (C++), in order to create the model of the configuration defined by the third configuration corresponding to FIG. 8c. The Configurator can thus, with the user-developer, create its own model in accordance with the configuration variant chosen.

It would have been possible, in the same way, to illustrate the other variants of embodiment of the model (FIGS. 8a; 8b and 8d through 8f) that could be processed by the Configurator system in order to produce the corresponding result files constituting the simulation models of the system architecture envisioned for the integrated circuit under development.

FIG. 2 represents the various means used by a computer system 40 implementing the method of the invention.

The computer 40 includes a central processor 41 comprising data processing circuits 42 (an arithmetic and logic unit ALU and memories of associated programs, hereinafter referred to globally as ALU, for convenience), and includes various memories, programs or working data files associated with the central processor 41.

The central processor 41 includes a memory 51 containing the component and connection rule table (TCRC), the connection coherency rule table (TRCOH) and the source file formatting table (TFMT). These tables are created from the architecture description file (FDARCH).

The memory 51 also contains the necessary programs or intelligent engines PROGCONF for constituting the Configurator system, which are usable by the ALU 42.

A memory 53 contains the instance connection table (TCINST) representing the instances of the components and their mutual interconnections required by the Configuration defined in the configuration definition file (FCONF) and conforming to the rules contained in the tables TCRC and TRCOH.

The memory 53 also contains the wiring table (TCAB) representing the physical connections (wires) between the HDL-type parts of the components instantiated from the HDL-type source file library (BFSHDL).

This results in the files MGHDL and MGHLL, which respectively represent the HDL-type (VERILOG or VHDL) and HLL-type (C++) source files of the global simulation model generated by the Configurator system, a model that allows the co-simulation of an ASIC circuit in its verification environment.

The implementation of the method of the invention will now be explained.

Figure 2A:
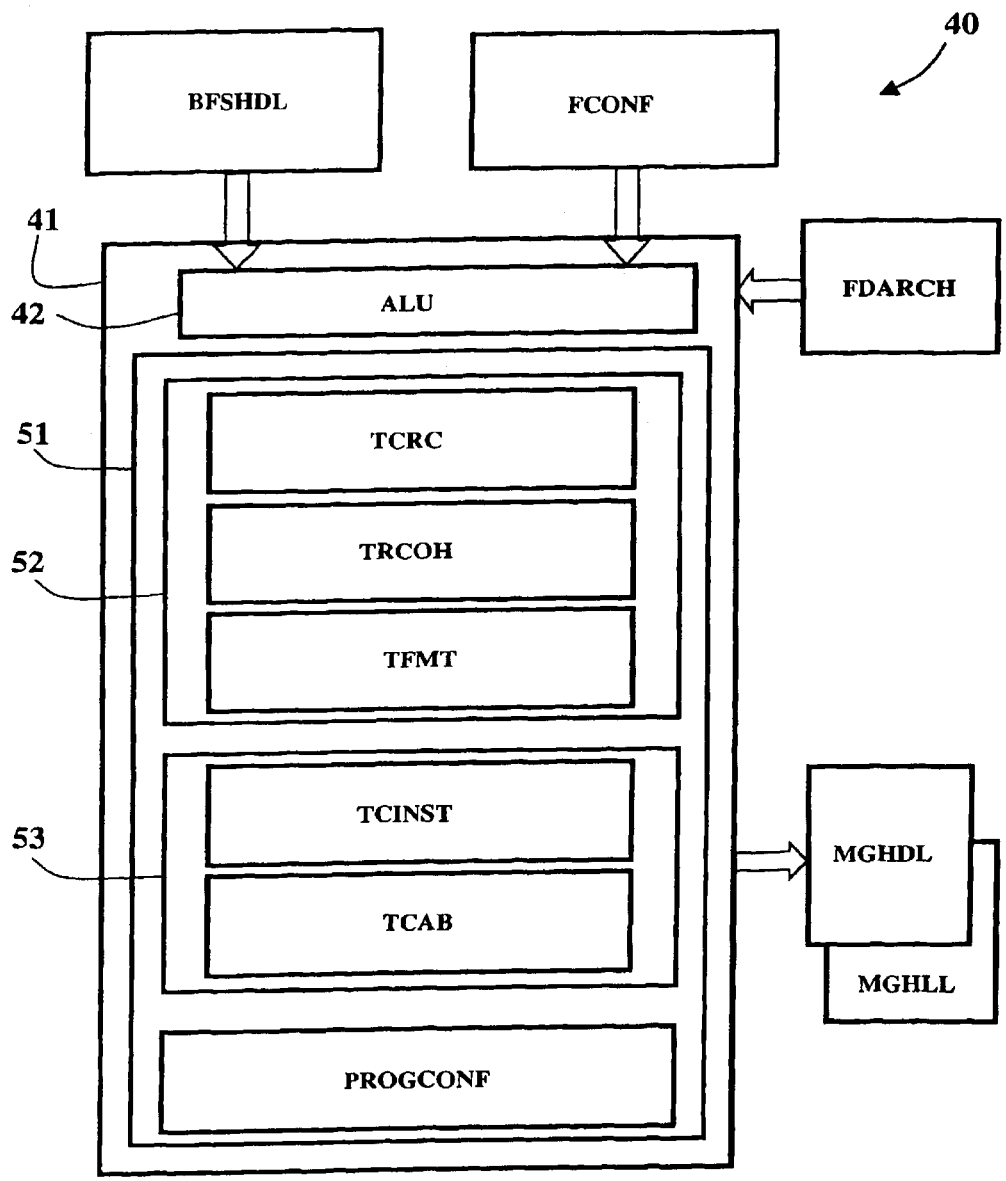
FIGS. 2A through 2D are diagrams illustrating the various components of the Configurator system and the steps for implementing these components in the method of the invention.
Figure 2B:
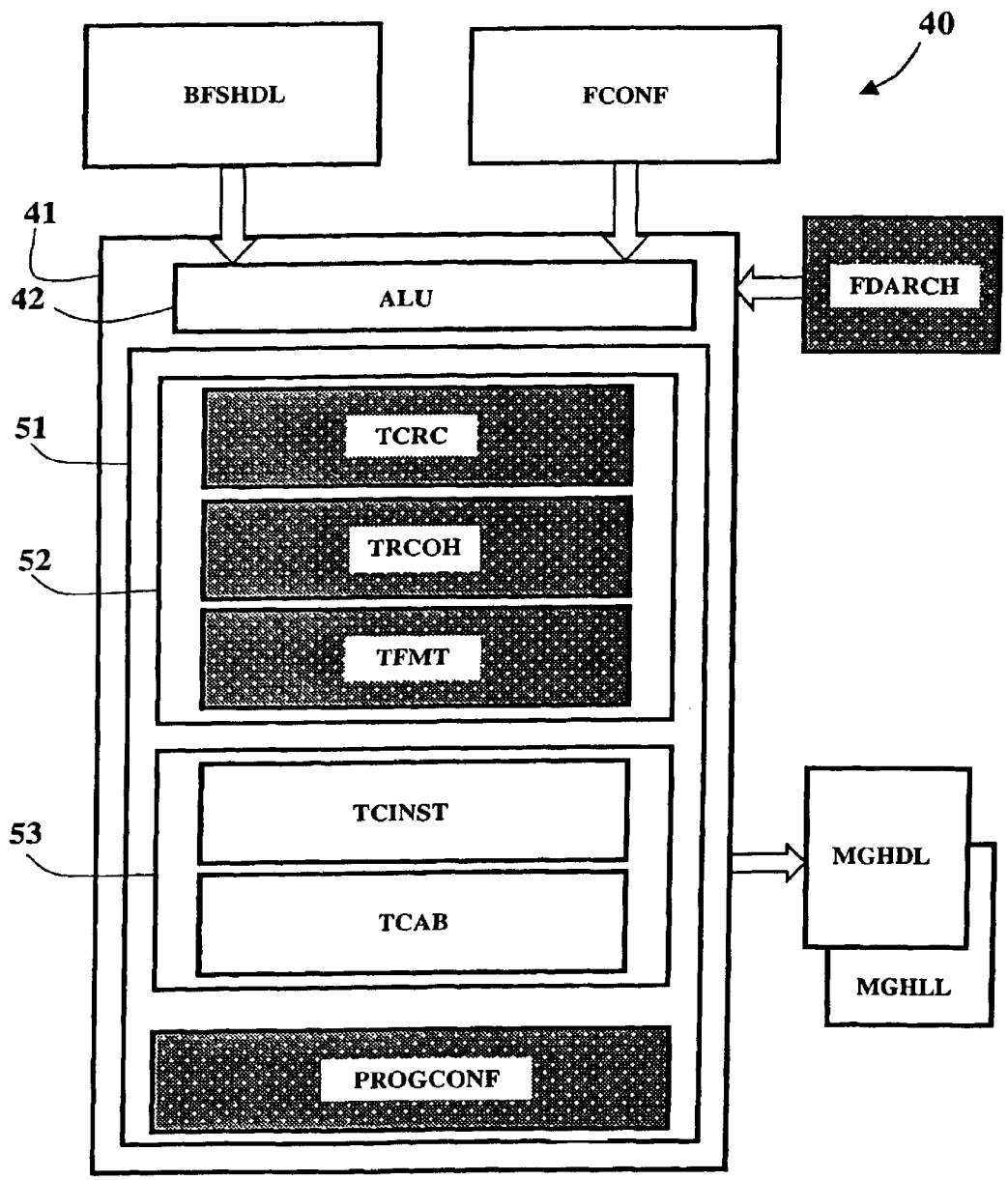
Figure 2C:
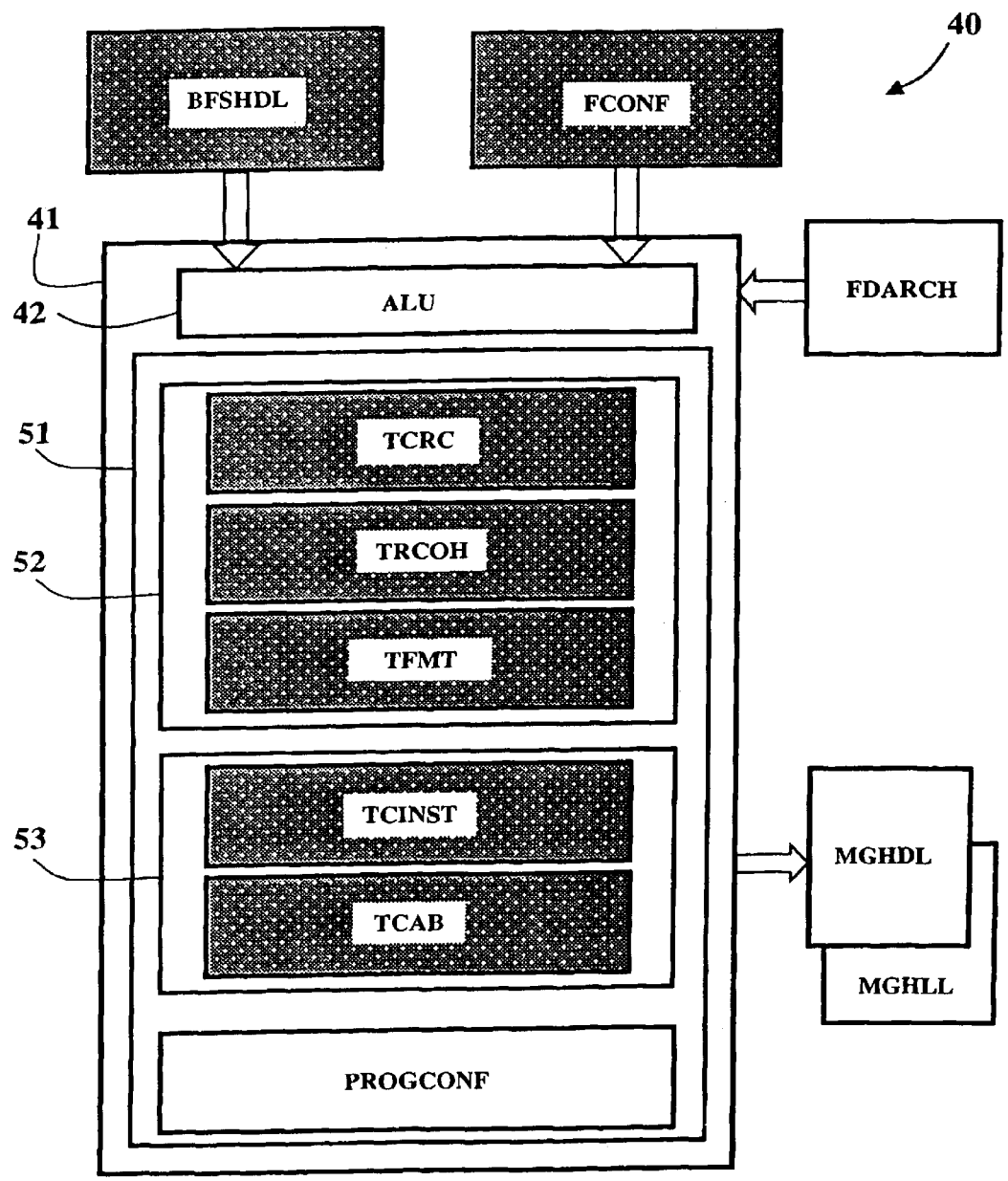
Figure 2D:
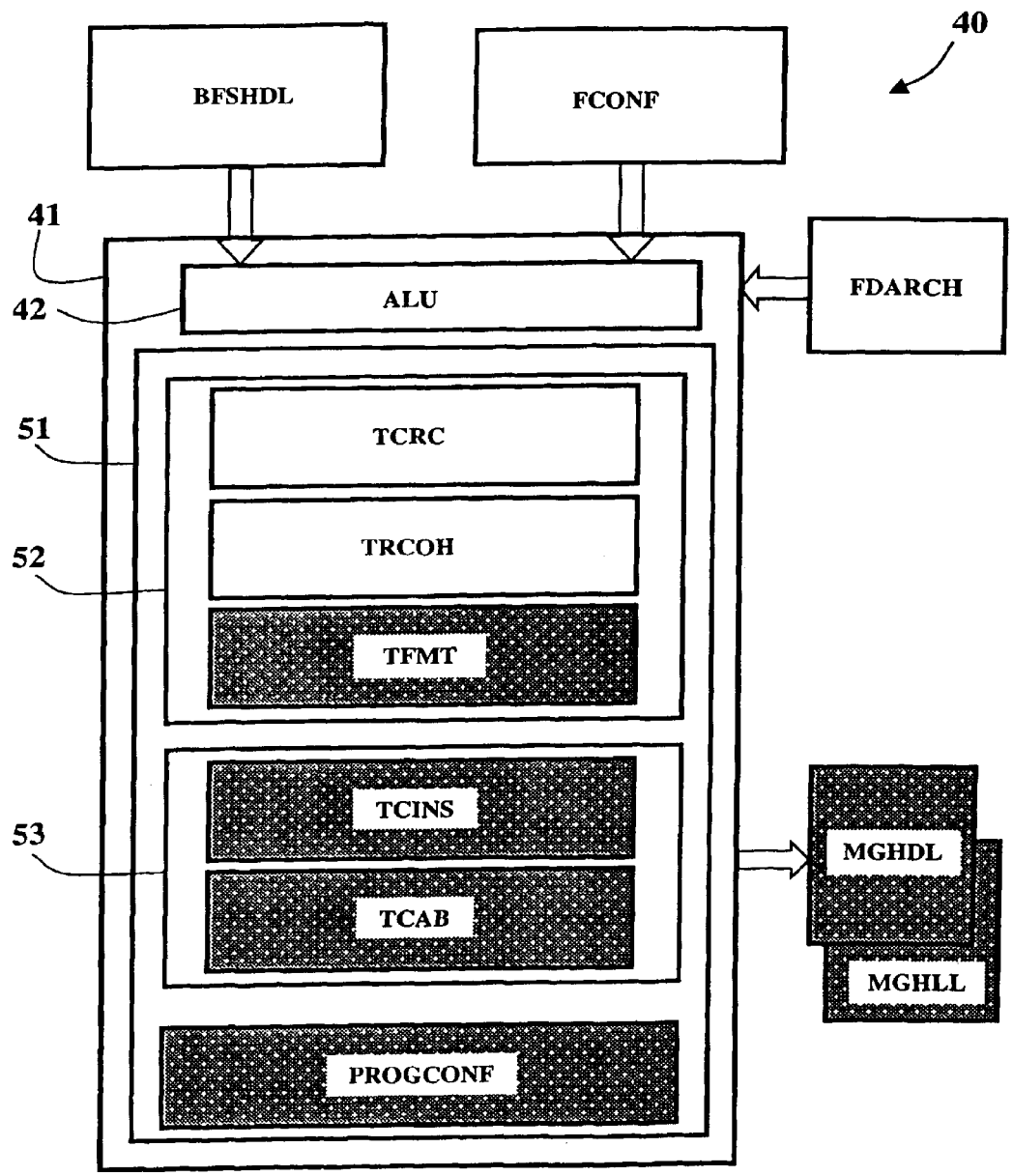

The method for automatically generating, by means of the computer or data processing system 40, a simulation model of a configuration of models of given components, mutually linked by interworking connections so as to create a global simulation model MGHDL/MGHLL of an ASIC circuit in its verification environment, comprises (see FIG. 2a):

an operator, possibly aided or even replaced by a computer, generating the architecture description file (FDARCH) describing the rules for interconnection between the various components, the models being capable of being used to model each of these components and the formatting rules in order to generate the source files of the resulting model;

an operator, possibly aided or even replaced by a computer, generating the source file library BFSHDL from HDL-type parts of models of respective components capable of being used in a configuration in conformity with the content of the file FDARCH;

an operator generating the desired configuration definition file (FCONF), which identifies the components and the desired models (see FIG. 2b);

data processing system reading the architecture description file (FDARCH) and generates and places in memory the tables TCRC, TRCOH and TFMT from FDARCH (see FIG. 2b);

the various tables TCRC, TRCOH and TFMT having been made accessible to the data processing system 40 (see FIG. 2c);

the data processing system 40 reading the desired configuration definition file (FCONF) in order to identify the components and their required models (see FIG. 2c);

the data processing system 40 reading the component and connection rule table in order to instantiate the required components and place them in the instance connection table TCINST (see FIG. 2c);

the data processing system 40 reading the connection coherency rule table (TRCOH) in order to verify the physical connectivity between models and, if necessary, inserts intermediate components;

the data processing system 40 reading, in the library BFSHDL, the source files corresponding to the HDL-type parts of the component models instantiated in the table TCINST in order to generate the table TCAB of physical connections (wires) between the component models (see FIG. 2c); and the data processing system 40 applies the formatting rules from the table TFMT to the contents of the tables TCINST and TCAB, and it generates the final source files MGHDL/MGHLL of the global simulation model corresponding to the configuration specified by the configuration definition file (FCONF) (see FIG. 2d).

The input file FCONC corresponds to a description of the theoretical diagram of the type in FIG. 1, but without the models, which are added during the generation of the intermediate tables TCINST, TCAB describing the configuration and connections, in order to provide a global simulation model that is actually operational and that, moreover, allows the observation of particular signals.

The various tables above can be pre-stored in the data processing system 40 or can even be stored in an external memory that one connects to the data processing system 40, possibly through a data transmission network, in order to make them accessible.

The ALU 42 has all of the basic data required by the table tools TCRC, TRCOH, TFMT in order for the program PROGCONF associated with the Configurator system to control, in the ALU 42, the generation of the final files MGH-DUMGHLL (see FIG. 2d).

The intermediate table TCAB describing the physical connections generated from an HDL-type description, is, in this example, subjected to a verification in order to detect any obvious errors, such as the existence of unconnected inputs or outputs or even outputs connected in parallel, when there should be conventional outputs of the so-called "totem-pole" type, as opposed to those of the open collector or tri-state type.

In case of a modification of the initial file FCONF, the intermediate tables TCINST, TCAB and the final files MGHDL/MGHLL can thus be redefined from the files of models and from the file FDARCH. This avoids any risk of error.

In this example, the ALU 42 generates a global co-simulation model by associating, with at least one functional block, several functional specification models written in programming languages of different levels, in this case of the HDL and C++ types.

It is understood that the present invention can be implemented in other specific forms without going beyond its scope of application as claimed. Consequently, the present detailed description should be considered to be a simple illustration of a particular case within the context of the invention, and can therefore be modified without going beyond the scope defined by the attached claims.

The invention claimed is:

1. A computer system for automatically generating a simulation model for a selected configuration of software simulation elements, comprising:

storage means for storing a plurality of said software simulation elements, said plurality of software simulation elements provided with interworking connections so as to constitute the simulation model of an architecture, each said software simulation element representing a component; and a data processing system comprising execution means provided with configuration means that comprises:
  means for creating a simulation of wiring by executing stored regular expressions,
  means for using a configuration definition file, a component and connection rule table, and a connection coherency rule table, wherein the component and connection rule table and the connection coherency rule table are written in a high level language (HLL), and the component and connection rule table describes properties of said components for simulating at least one of a plurality of integrated circuits,
  means for instantiating components based on the configuration definition file,
  an HLL code generator that combines parameters of the components with connection rules of the component and connection rule table,
  means for automatically generating source code files comprising the simulation model corresponding to the selected configuration specified by the configuration definition file, and
  means for indirectly connecting components whose parts are not directly connectable, the means being connected head-to-tail between said components,
  wherein the simulation model comprises software simulation elements each corresponding to an integrated circuit under development, the integrated circuits together comprise the design of a processing machine that conforms to a functional specification of the selected configuration as defined in the configuration definition file, and
  wherein the integrated circuits are not physically present in the processing machine.

2. The system according to claim 1, wherein the components comprise Active Components, Monitoring and Verification Blocks, Intermediate Blocks, System Blocks, and Global Blocks.

3. The system according to claim 2, further comprising means to perform a conformity check of connections by comparing an instance connection table with a table of coherency rules for physical connections between the models chosen for blocks constituting the simulation model.

4. The system according to claim 3, further comprising means to compare the instance connection table to the connection coherency rule table to detect any incompatible connections between ends of connections between blocks, and in cases where an incompatible connection is detected, the system is configured to specify and add an adapter component (Intermediate Block) to the instance connection table, said adapter component being inserted into the detected incompatible connection between the components.

5. The system according to claim 4, wherein the component and connection rule table includes properties of the components and contains parameters common to all of the component types and exists in the form of a table distributed into one or more associative tables, wherein table entries are names designating possible models for the same component.

6. The system according to claim 5, wherein the associative tables are adapted to contain a description either in the form of parameter sets or in the form of references to procedures that generate a set of values, and
  entries of the associative tables comprise names each of which designates a the possible model for the same component and form a character string containing predetermined special identifiers that are replaced by values calculated by the configuration means.

7. The system according to claim 6, wherein at least three selectors indicate the instance to be used, and in which the following selectors are transmitted as parameters to a constructor of an HLL object:
  a first selector indicating a current instance (item);
  a second selector specifying the current instance connected to an end of a port; and
  a third selector indicating a composite instance corresponding to an active Component containing an observation port.

8. The system according to claim 1, wherein the configuration means further comprises:
  one or more connection coherency rule tables representing the rules for interconnecting the components and for inserting intermediate components;
  one or more component and connection rule tables representing the system-level connection rules and the rules for generating connections between the signals; and
  one or more source file formatting tables representing the rules for generating instances of HLL objects.

9. The system according to claim 1, wherein the configuration means further comprises:
  an HLL base class uniquely identifying each object instantiated;
  means for generating and automatically instantiating System Blocks;
  means for using tables to associate the signals connected together under a unique name of the connecting wires; and
  means for using a formatting table to generate hardware description language (HDL) and HLL source files.

10. The system according to claim 1, wherein the system is configured to receive from an operator a functional specification of the configuration in a high level language, and to complete the functional specification with the components in a language other than said high level language.

11. The system according to claim 1, wherein the following entries in a hash define a Component Type and correlate each Component Type to the hash, said hash comprising the following:
  a first entry comprising a name of a hardware description language (HDL) module of a component and a name of a corresponding source file; and
  a second entry comprising a definition of a method for selecting signals that are part of a Port, said definition comprising a set of entries indexed by a name of the Port;
  wherein the configuration means is configured to associate each said Port name with a table of regular expressions and a pointer to a signal connection procedure that controls the application of the expressions to the names of signals of an interface of the component.

12. The system according to claim 11, wherein said Component Type comprises one or more Active Components having a generic structure that includes a containing Block that contains an HDL Block including an HDL description and a Block in HLL that provides access paths to HDL resources and a description of the containing block in the high level language;
  wherein the set of signals of the HDL Block constitutes an interface of the containing Block, formed by one or more Ports comprising logical selections of signals of the interface, and also formed by interface adapters which provide, in each said Port, two-way communication between the high level language and the hardware description language for interface adapters being selected by the configuration means.

13. The system according to claim 12, wherein the Ports are specified in the form of regular expressions that select subsets of signals to be connected and define connection rules.

14. The system according to claim 1, wherein the configuration means is further configured to generate Transfer Components which are inserted to be operable at each side of an interface between servers, said Transfer Components comprising wires for inputs and registers for outputs.

15. A method for automatically generating a simulation model for a selected configuration of software simulation elements, comprising:
storing a plurality of said software simulation elements, said plurality of software simulation elements provided with inter working connections so as to constitute the simulation model of an architecture, each said software simulation element representing a component;
creating a simulation of wiring by executing stored regular expressions;
using a configuration definition file, a component and connection rule table, and a connection coherency rule table, wherein the component and connection rule table and the connection coherency rule table are written in a high level language, and the component and connection rule table describes properties of said components for simulating at least one of a plurality of integrated circuits;
instantiating components based on the configuration definition file;
combining, via a high level language (HLL) code generator, the parameters of the components with the connection rules of the component and connection rule table;
automatically generating source code files comprising the simulation model corresponding to the selected configuration specified by the configuration definition file; and
inserting intermediate components connected head-to-tail between components whose parts are not directly connectable to indirectly connect said components,
wherein the simulation model comprises software simulation elements each corresponding to an integrated circuit under development, the integrated circuits together comprise the design of a processing machine that conforms to a functional specification of the selected configuration as defined in the configuration definition file, and
wherein the integrated circuits are not physically present in the processing machine.

16. The method according to claim 15, wherein the components comprise Active Components, Monitoring and Verification Blocks, Intermediate Blocks, System Blocks, and Global Blocks.

17. The method according to claim 16, further comprising performing a conformity check of connections by comparing an instance connection table with a table of coherency rules for physical connections between models chosen from the blocks to constitute the simulation model.

18. The method according to claim 17, further comprising:
comparing the instance connection table to the connection coherency rule table to detect any incompatible connections between the ends of the connections between blocks; and
in cases where an incompatible connection is detected, specifying and adding an adapter component (Intermediate Block) to the instance connection table, said adapter component being inserted into the detected incompatible connection between the components.

19. The method according to claim 18, wherein the component and connection rule table includes properties of the components and contains parameters common to all of the component types and exists in the form of a table distributed into one or more associative tables, and entries being names designating all possible models for the same component.

20. The method according to claim 19, wherein the associative tables are adapted to contain a description either in the form of parameter sets or in the form of references to procedures that generate a set of values, and
wherein entries of the associative tables comprise names each of which designates a possible model for the same component, and form a character string containing predetermined special identifiers that are replaced by calculated values.

21. The method according to claim 20, further comprising:
indicating, using at least three selectors, the instance to be used; and
transmitting the following selectors as parameters to a constructor of an HLL object:
a first selector indicating a current instance (item);
a second selector specifying the current instance connected to an end of a port; and
a third selector indicating a composite instance corresponding to an active Component containing an observation port.

22. The method according to claim 15, further comprising:
representing, by one or more connection coherency rule tables, the rules for interconnecting the components and for inserting intermediate components;
representing, by one or more component and connection rule tables, the system-level connection rules and the rules for generating connections between the signals; and
representing, by one or more source file formatting tables, the rules for generating instances of HLL objects.

23. The method according to claim 15, further comprising:
uniquely identifying, via an HLL base class, each object instantiated;
generating and automatically instantiating System Blocks;
using tables to associate the signals connected together under a unique name of the connecting wires; and
using a formatting table to generate the hardware description language and HLL source files.

24. The method according to claim 15, further comprising:
receiving, from an operator, a functional specification of the configuration in a high level language; and
completing the functional specification with the components in a language other than said high level language.

25. The method according to claim 15, further comprising:
defining, using the following entries in a hash, a Component Type; and
correlating, using the following entries in the has, each Component Type to the hash, wherein said hash comprises the following:
a first entry comprising a name of a hardware description language (HDL) module of a component and a name of a corresponding source file; and
a second entry comprising a definition of a method for selecting the signals that are part of a Port, said definition comprising a set of entries indexed by a name of the Port; wherein
said method further includes associating each said Port name with a table of regular expressions and a pointer to a signal connection procedure that controls the application of the expressions to the names of the signals of the interface of the component.

26. The method according to claim 25, wherein said Component Type comprises one or more Active Components having a generic structure that includes a containing Block that contains an HDL Block including an HDL description and a Block in HLL that provides access paths to HDL resources and a description of the containing block in the high level language;
    wherein the set of signals of the HDL Block constitutes an interface of the containing Block, formed by one or more Ports comprising arbitrary logical selections of signals of an interface, and also formed by interface adapters which provide, in each said Port, two-way communication between the high level language and the hardware description language.

27. The method according to claim 26, further comprising specifying the Ports in the form of regular expressions that select subsets of signals to be connected and define connection rules.

28. The method according to claim 15, further comprising generating Transfer Components which are inserted to be operable at each side of an interface between servers, said Transfer Components comprising wires for inputs and registers for outputs.

* * * * *

UNITED STATES PATENT AND TRADEMARK OFFICE
CERTIFICATE OF CORRECTION

PATENT NO. : 7,865,344 B2  Page 1 of 1
APPLICATION NO. : 10/627977
DATED : January 4, 2011
INVENTOR(S) : Andrzej Wozniak It is certified that error appears in the above-identified patent and that said Letters Patent is hereby corrected as shown below:

In the following:

Column 32 – Line 51, delete "has" and insert --hash--.

Signed and Sealed this
Nineteenth Day of April, 2011

David J. Kappos
*Director of the United States Patent and Trademark Office*